(12) United States Patent
Akejima

(10) Patent No.: US 11,557,542 B2
(45) Date of Patent: Jan. 17, 2023

(54) ELECTRONIC CIRCUIT DEVICE AND METHOD OF MANUFACTURING ELECTRONIC CIRCUIT DEVICE

(71) Applicant: RISING TECHNOLOGIES CO., LTD., Yokohama (JP)

(72) Inventor: Shuzo Akejima, Yokohama (JP)

(73) Assignee: RISING TECHNOLOGIES CO., LTD., Yokohama (JP)

(*) Notice: Subject to any disclaimer, the term of this patent is extended or adjusted under 35 U.S.C. 154(b) by 10 days.

(21) Appl. No.: 17/107,806

(22) Filed: Nov. 30, 2020

(65) Prior Publication Data
US 2021/0082828 A1    Mar. 18, 2021

Related U.S. Application Data

(63) Continuation of application No. PCT/JP2020/011640, filed on Mar. 17, 2020.

(30) Foreign Application Priority Data

May 16, 2019 (JP) .............................. JP2019-092807

(51) Int. Cl.
*H01L 23/538* (2006.01)
*H01L 21/48* (2006.01)
(Continued)

(52) U.S. Cl.
CPC ...... *H01L 23/5389* (2013.01); *H01L 21/4853* (2013.01); *H01L 21/4857* (2013.01);
(Continued)

(58) Field of Classification Search
CPC ............. H01L 21/4853; H01L 21/4857; H01L 21/565; H01L 21/568; H01L 21/6835;
(Continued)

(56) References Cited

U.S. PATENT DOCUMENTS 6,803,324 B2    10/2004 Ogawa et al.
7,514,636 B2    4/2009 Sasaki
(Continued)

FOREIGN PATENT DOCUMENTS

CN    108780791 A    11/2018
EP      3339023 A1 *  6/2018    .............. G03F 7/40
(Continued)

OTHER PUBLICATIONS

Office Action dated Apr. 19, 2021 issued in Co-pending U.S. Appl. No. 16/812,268.
(Continued)

*Primary Examiner* — Timor Karimy
(74) *Attorney, Agent, or Firm* — Franklin & Associates International Inc; Matthew F. Lambrinos

(57) ABSTRACT

An electronic circuit device according to the present invention includes a base substrate including a wiring layer having a connection part, at least one electronic circuit element, and a re-distribution layer including a photosensitive resin layer, the photosensitive resin layer enclosing a surface on which a connection part of the electronic circuit element is formed and a side surface of the electronic circuit element and embedding a first wiring photo via, a second wiring photo via and a wiring, the first wiring photo via directly connected to the connection part of the electronic circuit element, the second wiring photo via arranged at the outer periphery of the electronic circuit element and directly connected to a connection part of the wiring layer, the wiring electrically connected to the first wiring photo via and the second wiring photo via on a same surface.

9 Claims, 18 Drawing Sheets

(51) Int. Cl.
  *H01L 21/56* (2006.01)
  *H01L 21/683* (2006.01)
  *H01L 23/31* (2006.01)
  *H01L 23/00* (2006.01)
  *H01L 25/065* (2006.01)
  *H01L 25/00* (2006.01)

(52) U.S. Cl.
  CPC .......... *H01L 21/565* (2013.01); *H01L 21/568* (2013.01); *H01L 21/6835* (2013.01); *H01L 23/3128* (2013.01); *H01L 23/5383* (2013.01); *H01L 23/5386* (2013.01); *H01L 24/19* (2013.01); *H01L 24/20* (2013.01); *H01L 25/0657* (2013.01); *H01L 25/50* (2013.01); *H01L 2221/68372* (2013.01); *H01L 2224/214* (2013.01); *H01L 2225/06562* (2013.01); *H01L 2225/06586* (2013.01)

(58) Field of Classification Search
  CPC ..... H01L 24/19; H01L 24/20; H01L 25/0657; H01L 25/50; H01L 23/5389; H01L 23/3128; H01L 23/5383; H01L 23/5386; H01L 2221/68372; H01L 2224/214; H01L 2225/06562; H01L 2225/06586
  See application file for complete search history.

(56) References Cited

U.S. PATENT DOCUMENTS

| | | |
|---|---|---|
| 8,643,164 B2 | 2/2014 | Kaufmann et al. |
| 9,318,429 B2 | 4/2016 | Hu et al. |
| 9,595,482 B2 | 3/2017 | Chen |
| 10,354,964 B2 | 7/2019 | Yu et al. |
| 2005/0017346 A1* | 1/2005 | Yamagata ........... H01L 23/5389 257/701 |
| 2007/0052067 A1 | 3/2007 | Umemoto |
| 2009/0000114 A1 | 1/2009 | Rao et al. |
| 2010/0213599 A1 | 8/2010 | Watanabe et al. |
| 2012/0300425 A1* | 11/2012 | Nakashima ......... H01L 23/5389 361/761 |
| 2013/0157419 A1 | 6/2013 | Shimizu et al. |
| 2015/0016079 A1 | 1/2015 | Furutani et al. |
| 2015/0179616 A1 | 6/2015 | Lin et al. |
| 2015/0194388 A1 | 7/2015 | Pabst et al. |
| 2015/0259194 A1 | 9/2015 | Lin et al. |
| 2016/0276307 A1 | 9/2016 | Lin |
| 2017/0025380 A1 | 1/2017 | Zhai et al. |
| 2017/0287874 A1 | 10/2017 | Fang et al. |
| 2018/0130745 A1 | 5/2018 | Hu et al. |
| 2019/0043835 A1 | 2/2019 | Lee et al. |
| 2019/0378801 A1 | 12/2019 | Leitgeb et al. |
| 2021/0005555 A1 | 1/2021 | Akejima |
| 2021/0084762 A1 | 3/2021 | Akejima |

FOREIGN PATENT DOCUMENTS

| | | | |
|---|---|---|---|
| EP | 3339023 A1 | | 6/2018 |
| JP | H11-233678 A | | 8/1999 |
| JP | 2005183548 | * | 7/2005 |
| JP | 2005183548 A | | 7/2005 |
| JP | 2007067216 A | | 3/2007 |
| JP | 2010219489 A | | 9/2010 |
| JP | 2013128060 A | | 6/2013 |
| JP | 2013236105 A | | 11/2013 |
| JP | 2015056458 A | | 3/2015 |
| JP | 2019033245 A | | 2/2019 |
| TW | 606563 B | | 11/2017 |
| WO | WO 2010/101163 | * | 3/2010 |
| WO | 2010101163 A1 | | 9/2010 |
| WO | 2019049899 A1 | | 3/2019 |
| WO | 2020208984 A1 | | 10/2020 |

OTHER PUBLICATIONS

Office Action dated Jan. 14, 2021 issued in TW Appl. No. 109112166. English translation attached.
Chien-Fu Tseng, Chung-Shi Liu, Chi-Hsi Wu, and Douglas Yu, "InFO (Wafer Level Integrated Fan-Out) Technology", 2016 IEEE 66th Electronic Components and Technology Conference, USA, Electronic Components and Technology Conference, 2016, DOI 10.1109/ECTC.2016.65, Cited in the specification of PCT/JP2020/011640.
ISR for PCT/JP2020/011640, dated May 26, 2020, English translation attached.
WO-ISA for PCT/JP2020/011640, dated May 26, 2020.
ISR for PCT/JP2018/032904, dated Oct. 30, 2018, English translation attached.
WO-ISA for PCT/JP2018/032904, dated Oct. 30, 2018, English translation attached.
ISR for PCT/JP2020/009810, dated Jun. 23, 2020, English translation attached.
WO-ISA for PCT/JP2020/009810, dated Jun. 23, 2020.
Specification of PCT/JP2020/022096.
Masaaki Ishida et. al, "Electromagnetic Shielding Technologies for Semiconductor Packages" TOSHIBA review, pp. 7p-10p, vol. 2, 2012, Cited in the specification of PCT/JP2020/022096 English machine translation attached.
Sheng-Chi Hsieh, Fu-Cheng Chu, Cheng-Yu Ho and Chen-Chao Wang, "Advanced Thin-Profile Fan-Out with Beamforming Verification for 5G WidebandAntenna", 2019 IEEE 69th Electronic Components and Technology Conference, USA, Electronic Components and Technology Conference, 2019, DOI 10.1109/ECTC.2019.00153, Cited in the specification of PCT/JP2020/022096.
ISR for PCT/JP2020/022096, dated Sep. 8, 2020.
WO-ISA for PCT/JP2020/022096, dated Sep. 8, 2020.
U.S. Appl. No. 17/107,596, filed Nov. 30, 2020, in the name of Rising Technologies Co., Ltd. and entitled "Electronic Circuit Device and Method of Manufacturing Electronic Circuit Device".
English translation of WO-ISA(ISA237) for PCT/JP2020/009810 dated Jun. 23, 2020. The original Japanese document was submitted in IDS of Dec. 1, 2020.
English translation of WO-ISA(ISA237) for PCT/JP2020/011640 dated May 26, 2020. The original Japanese document was submitted in IDS of Dec. 1, 2020.
English translation of ISR(ISA210) for PCT/JP2020/022096 dated Sep. 8, 2020. The original Japanese document was submitted in IDS of Dec. 1, 2020.
English machine translation of WO-ISA(ISA237) for PCT/JP2020/022096 dated Sep. 8, 2020. The original Japanese document was submitted in IDS of Dec. 1, 2020.
Notice of Allowance dated Oct. 19, 2021 issued in Co-pending U.S. Appl. No. 17/107,596.
Office Action dated Jan. 24, 2022 issued in TW Appl. No. 107131562. English translation attached.
Office Action dated Sep. 6, 2022 issued in JP Appl. No. 2019-076624. English machine translation attached.

* cited by examiner

FIG.12
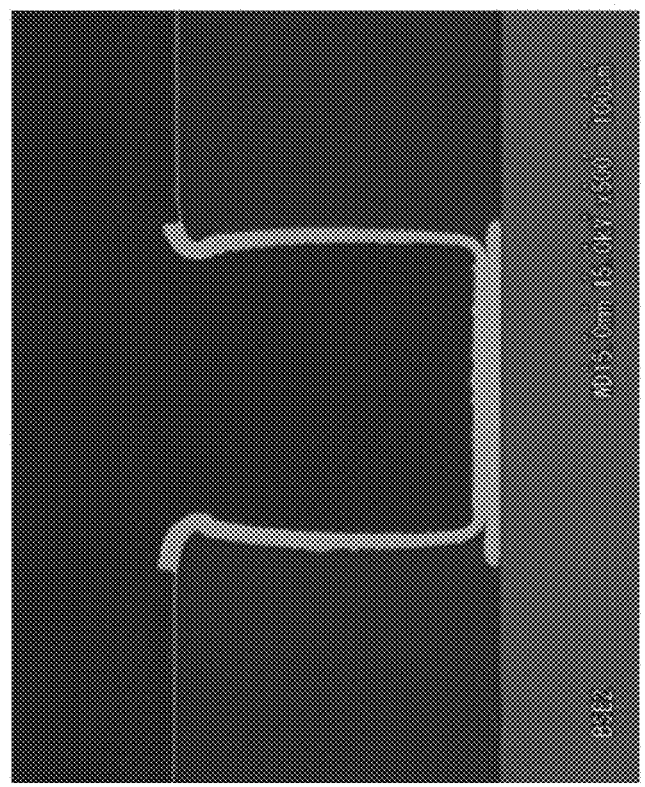
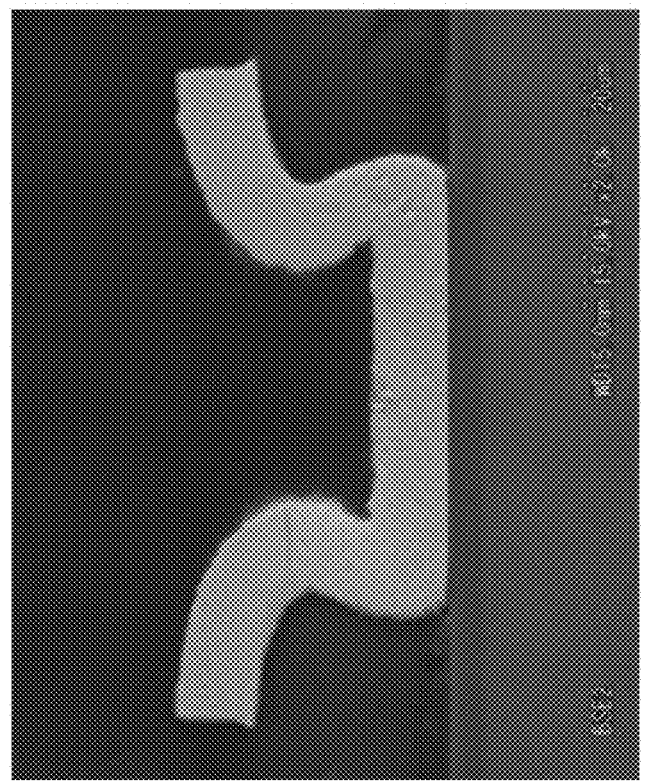

ELECTRONIC CIRCUIT DEVICE AND METHOD OF MANUFACTURING ELECTRONIC CIRCUIT DEVICE

CROSS REFERENCES TO RELATED APPLICATIONS

This application is a continuation application of International Patent Application No. PCT/JP2020/011640, filed on Mar. 17, 2020, entitled "ELECTRONIC CIRCUIT DEVICE AND METHOD OF MANUFACTURING ELECTRONIC CIRCUIT DEVICE", which is based upon and claims the benefit of priority from the prior Japanese Patent Application No. 2019-092807, filed on May 16, 2019, the entire contents of each of which is incorporated herein by reference.

FIELD

The present invention relates to an electronic circuit device and a method of manufacturing the electronic circuit device. In particular, the present invention relates to an electronic circuit device and a manufacturing method thereof that ensures the reliability of fan out wafer-level package (FOWLP) suitable for system integration and enables three-dimensional mounting at low-cost.

BACKGROUND

Various types of packaging have been put into practical use for integrated circuit devices (referred to as a semiconductor chip) in which sophisticated integrated circuit is configured. For example, wafer-level package (WLP) and FOWLP have been put into practical use in recent years. This FOWLP is called a Face-Up type or a Face-Down type depending on the mounting orientation of the semiconductor chip with respect to the substrate.

Face-Up type is less susceptible to vibrations in the manufacturing process or thermal expansion of the sealing resin, and is suitable for FOWLP requiring precision since the semiconductor chips contained therein are processed after being fixed to the base substrate. In recent Face-Up type, Cu pillars bonded on the connecting terminals of the respective semiconductor chips fixed to the base substrate is molded with the sealing resin, and chemical mechanical polishing (Chemical Mechanical Polishing: CMP) is applied to stack the relocated wiring structure (re-distribution layer) so as to form an electric connection at the tip of the exposed Cu pillars.

On the other hand, in the Face-Down type, after the surface on which the connecting terminal of the semiconductor chip is provided is fixed to the support material through an adhesive layer, the entire semiconductor chip is molded with resin, and then this support material is peeled off to expose the contact points of the semiconductor chip. The re-distribution layer is laminated on this exposed surface.

In particular, the Face-Up type FOWLP is suitable for the system integration using a plurality of semiconductor chips. Since it does not require a normal printed substrate, the package is thin and the wiring length is shortened, so that the inductance and the floating capacitance are reduced, and the transmission rate of signals can be increased.

SUMMARY

An electronic circuit device according to an embodiment of the present invention includes at least one electronic circuit element, and a re-distribution layer including a photosensitive resin layer, the photosensitive resin layer having insulation properties, the photosensitive resin layer enclosing a surface on which a connection part of the electronic circuit element is formed and a side surface of the electronic circuit element and embedding a first wiring photo via, a second wiring photo via and a wiring, the first wiring photo via directly connected to the connection part of the electronic circuit element, the second wiring photo via arranged at the outer periphery of the electronic circuit element and directly connected to a connection part of the wiring layer, the wiring electrically connected to the first wiring photo via and the second wiring photo via on a same surface parallel to a surface on which the connection part of the electronic circuit element is formed. The first wiring photo via and the second wiring photo via have a barrel shape, a bottom part of the first wiring photo via and the second wiring photo via connected to the connection part of the electronic circuit element and a sidewall of the first wiring photo via and the second wiring photo via are continuous, a hole surface of an upper part opposite to the bottom part is narrower than a hole surface of an intermediate part between the bottom part and the upper part, and the intermediate part of the second wiring photo via is gently curved.

A method of manufacturing an electronic circuit device according to an embodiment of the present invention includes forming a photosensitive resin layer by covering a surface on which a connection part of at least one electronic circuit element is formed and a side surface of the at least one electronic circuit element on a base substrate including a wiring layer having a connection part, and flattening an upper surface of the photosensitive resin layer covering the surface on which a connection part is formed, forming a first via hole and a second via hole by selectively exposing and developing the photosensitive resin layer, the first via hole exposing a connection part of the electronic circuit element, and the second via hole arranged around the electronic circuit element to expose a connection part of the wiring layer, and forming a first wiring photo via in the first via hole, a second wiring photo via in the second via hole and a wiring, the first wiring photo via electrically connected to the connection part of the electronic circuit element, the second wiring photo via directly connected to the connection part of the wiring layer, and a wiring for electrically connecting the first wiring photo via and the second wiring photo via on a same surface parallel to a surface on which the connection part of the electronic circuit element is formed. The first wiring photo via and the second wiring photo via are formed in a barrel shape in which a bottom part of the first wiring photo via and the second wiring photo via connected to the connection part of the electronic circuit element and a sidewall of the first wiring photo via and the second wiring photo via are continuous, a hole surface of an upper part opposite to the bottom part is narrower than a hole surface of an intermediate part between the bottom part and the upper part, and the intermediate part of the second wiring photo via is gently curved.

BRIEF EXPLANATION OF THE DRAWINGS

FIG. 12 is a cross-sectional photograph of the semiconductor device according to an embodiment of the present invention;

DESCRIPTION OF EMBODIMENTS

Figure 1:
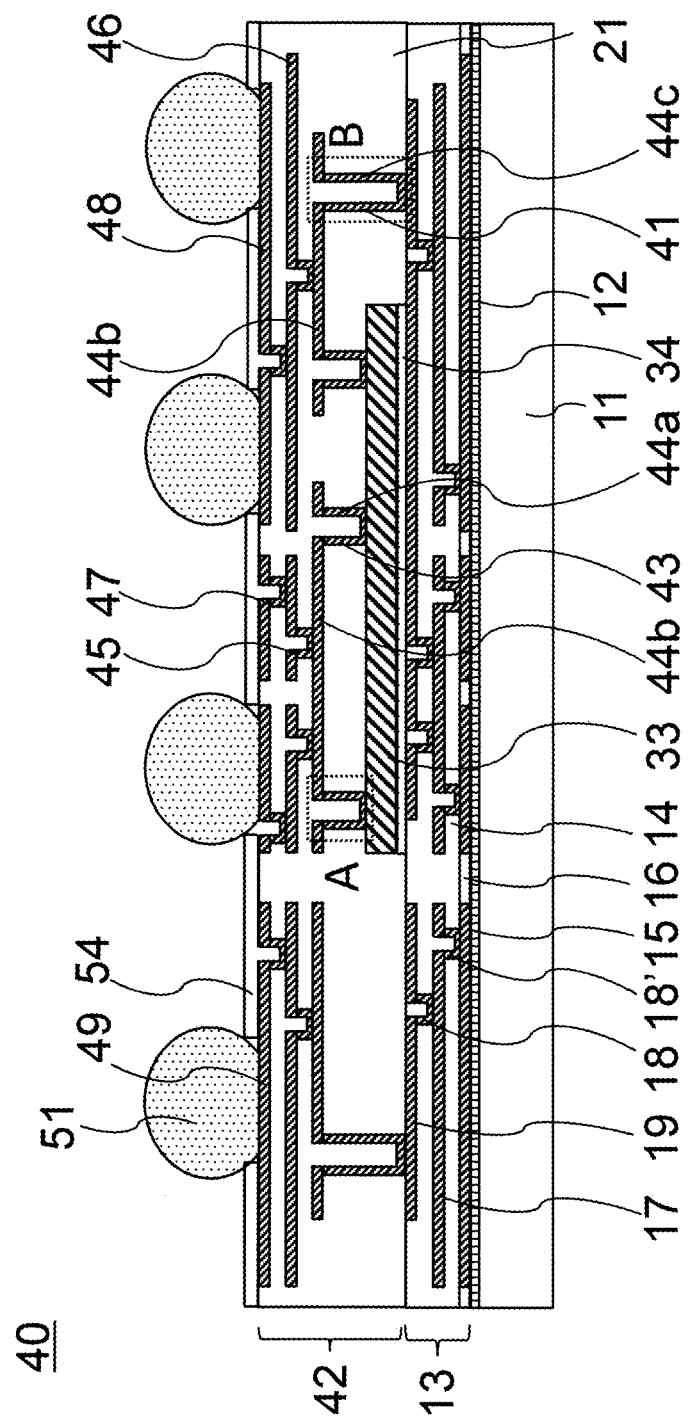
FIG. 1 is a cross-sectional view of a semiconductor device according to an embodiment of the present invention.

Hereinafter, referring to the drawings, an embodiment of the electronic circuit device and the method of manufacturing electronic information terminal and the electronic circuit device according to the present invention will be described. Here, an exemplary semiconductor device using the semiconducting integrated circuit devices such as an application processor chip is shown as the electronic circuit element. The electronic circuit device and the methods of manufacturing support member of the electronic circuit device and the electronic circuit device can be mounted in many different ways and are not to be construed as being limited to the description of the following embodiments. Note that in the drawings referred to in this embodiment, the same portions are denoted by the same reference numerals, and a repetitive description thereof is omitted.

Face-up type of FOWLP requires a complex and expensive manufacturing process such as high-precision formation of the Cu-pillars on the connecting terminal of the semiconductor chip, a high-flatness resin mold, subsequent CMP processing, stacking of the re-distribution layer. Furthermore, in the case of three-dimensionalization is aimed at system integration, a Face-up type three-dimensional FOWLP in which a long Cu-pillar is formed perpendicularly on the connecting terminal of this base substrate is also realized using a base substrate with the wiring layer. In such three-dimensional FOWLP, it is necessary to form long Cu pillar than the semiconductor chip thickness and short Cu pillar (those formed on the connecting terminal of the semiconductor chip) without positional deviation at the same time, become more complex and expensive. Although it has also been considered to mix and mount different types of semiconductor chips having different chip thicknesses, it has not been solved the problem of yield stability such as flatness ensuring of the resin mold for several different Cu pillars of lengths are complexly present.

However, inexpensive system integration of the semiconductor chip using a FOWLP structure is desired in the marketplace. For example, three-dimensionalization in which two semiconductor chips are stacked or two different types of semiconductor chips are juxtaposed is desired to be realized inexpensively. This is because the mounting area can be reduced even though the thickness of the semiconductor package is increased by about several hundred μm by three-dimensionalization. In particular, the application processor does not operate on its own, but operates by externally attaching large capacity dynamic random access memory (DRAM) or flash memory (Flash memory). It is possible to realize for the application processor to communicate a large amount of data over a wide data bus with non-specific standard packages of DRAM and Flash memories that have been stacked by three-dimensional FOWLP. In addition, the realization of the juxtaposition of the different types of semiconductor chips allows to easily mounting a plurality of chips with flexibility in the FOWLP structure, and therefore, it is expected that the scope of application as a single module which can easily meet customers and marketing requirements can be expanded.

Accordingly, an embodiment of the present invention provides an FOWLP structure and manufacturing method that is inexpensive, ensures reliability and suitable for the system integration of the semiconductor chip, thereby solve the problems of high costs, hindrance of high speeds and reduced reliability even in three-dimensionalization by stacking chips and juxtaposition of chips.

FIG. 1 is a cross-sectional view of a semiconductor device 40 according to an embodiment of the present invention. The semiconductor device 40 is a part in which a large number of the semiconductor device 40 are formed in the shape of a temporary wafer or a temporary panel, that is, the left and right ends in the drawing is connected to the semiconductor device 40 of the same configuration and are to be individualized in a later step.

The semiconductor device 40 includes a base substrate, an application processor chip (semiconductor device, first electronic circuit element) 33 FACE-UP mounted on a wiring layer 13 in the base substrate, and a re-distribution layer 42. The re-distribution layer 42 includes a film-like photosensitive resin 21 enclosing the chip 33. The tip 33 has a thickness of about 70 μm, and the photosensitive resin layer 21 has a thickness of about 100 μm.

As shown in FIG. 1, the base substrate in this embodiment includes a substrate 11, a release layer 12 formed on the substrate 11, and a wiring layer 13 formed on the release layer 12. The wiring layer 13 has a thickness of about 30 µm to 50 µm and a multi-layer wiring structure is formed in advance (shows three layers in the drawing, but the number of layers is not limited thereto).

The substrate 11 has a form depending on the manufacturing facility, and is made of a material such as glasses or plastics having light transmittance and rigidity, or non-transparent silicones or metals. The release layer 12 is formed on the substrate 11, and the materials of the release layer 12 are an adhesive layer and a pure release layer. The substrate 11 is finally removed by peeling the release layer 12 by laser treatment.

The wiring layer 13 is prepared in advance on the substrate 11. This wiring layer has a multi-layer construction and has copper wiring layer 15, 17, 19 patterned for each layer, an insulating film 14 which isolates between the copper wiring layer 15, 17, 19, and vias 18, 18' which connect the layers of the copper wiring layer 15, 17, 19. Since the release layer 12 is later stripped, an insulating layer 16 is formed in contact with the release layer 12, which is made of solder resist or other insulating film. The part where the insulating layer 16 does not exist is the copper wiring layer 15 and functions as a connection pad (hereinafter also referred to as the connection pad 15).

In the present embodiment, the base substrate includes the substrate 11, the release layer 12, and the wiring layer 13. However, the present invention is not limited to this, and the base substrate may be composed of only the substrate 11, or may be composed of only the wiring layer 13 having sufficient hardness that does not hinder the manufacturing process. In any case, the wiring layer 13 will remain until the end product.

The tip 33 is fixed on the wiring layer 13 of the base substrate prepared in advance via an adhesive layer 34. The chip 33 is Face-up mounted so that the circuit-forming surface having a plurality of the connection pad (connection part) faces away from the base substrate. Although one Chip 33 is arranged in the present embodiment, two or more chips 33 may be arranged.

The insulated photosensitive resin layer 21 is formed on the chip 33, and this photosensitive resin layer 21 completely encloses the chip 33 on the base substrate. The photosensitive resin layer 21 embeds sides and a surface of the chip 33 on which a plurality of connection pads is formed. The chip 33 is embedded in the photosensitive resin layer 21, and the entire upper surface is flattened by the photosensitive resin layer 21. Here, the surface of the chip 33 on which the plurality of connection pads is formed corresponds to the upper surface in the drawing. The thickness of the photosensitive resin layer 21 on the base substrate differs from the thickness of the photosensitive resin layer 21 on the chip 33. The thickness of the photosensitive resin layer 21 (the thickness on the base substrate) is determined by the relation with the lithography process, although the maximum thickness at which the photo via can be formed is the maximum value. It has been demonstrated that the photo via can be formed with the silicone-based photosensitive resin (resin having the Young's modulus of 1 GPA or less at room temperature, 0.1 GPA or less at 120° C., and exposure amount of 800 mJ/cm$^2$ or more and 2600 mJ/cm$^2$ or less) up to a thickness of about 180 µm to 200 µm without any problems in terms of quality. Further, in order to suppress the thickness with reliably covering the chip 33, the thickness of the area overlapping the chip surface having its connection pads of the photosensitive resin layer 21 is preferably 5 µm or 50 µm or less.

The re-distribution layer 42 includes the photosensitive resin layer 21 and a copper wiring layer 44. The photosensitive resin layer 21 includes, the via hole 43 exposing the connection pad which is a part of the chip 33, and the via hole 41 exposing the connection pad of the copper wiring layer 19 of the wiring layer 13 in the base substrate. The copper wiring layer 44 includes a wiring photo via 44a (first wiring photo via) arranged at the inner surface and the bottom surface of the via hole 43, a wiring 44b arranged substantially parallel to the chip surface on which the connection pads of the chip 33 are arranged, and a wiring photo via 44c (second wiring photo via) arranged at the inner surface and the bottom surface of the via hole 41. A part of wiring photo vias 44a and 44c is a power or a ground line, and the wiring photo vias 44a and 44c constituting the power or the ground line are multiplexed so as to cope with a disconnection failure. The wiring 44b is arranged substantially parallelly between the base substrate surface (lower surface) of the photosensitive resin layer 21 and the surface opposite to the base substrate (upper surface) of the photosensitive resin layer 21. In the present embodiment, the wiring photo via 44a arranged at the inner surface and bottom surface of the via hole 43, the wiring 44b, and the wiring photo via 44c arranged at the inner surface and bottom surface of the via hole 41 is integrated. That is, the wiring photo via 44a, the wiring 44b, and the wiring photo via 44c are connected at the same surface. However, the present invention is not limited to this, the wiring photo via 44a, the wiring 44b, and the wiring photo via 44c may be electrically connected to each other. With such configuration, the chip 33, the wiring layer 13, and the re-distribution layer 42 containing the chip 33 are three-dimensionally connected through the copper wiring layer 44.

An insulating photosensitive resin constituting the photosensitive resin layer 21 is arranged on the inner surface of the wiring photo via 44a and 44c arranged in the via holes 41 and 43. The inside of the wiring photo via 44a and 44c is filled with the photosensitive resin layer 21. By filling the interior of the wiring photo via 44a and 44c with photosensitive resins, the copper wiring layer can be formed in which the wiring 44b, the wiring photo via 44a and 44c are integrated, without requiring expensive and complicated manufacturing steps to fill the entire wiring photo via 44a and 44c with metallic plating. Therefore, it is possible to suppress an increase in manufacturing cost due to the addition of a special manufacturing process. Thus, the copper wiring layer 44 is embedded in the photosensitive resin layer 21. The structures of the wiring photo vias 44a and 44c will be described in detail later.

The re-distribution layer 42 is three-layer copper wiring layers 44, 46, 48 (metallic wiring layer), but may be further multi-layered or single-layered or double-layered. The copper wiring layer 44 and the wiring photo via 44a and 44c having different depths are integrally formed of copper by the electroplating process after depositing nickel or copper as a base and further covered with a photosensitive resin. A patterned copper wiring layer 46 is formed on the copper wiring layer 44 and further covered with a photosensitive material. The copper wiring layer 46 is connected to the copper wiring layer 44 via wiring photo via 45. The patterned copper wiring layer 48 is formed on the upper layer of the copper wiring layer 46. The copper wiring layer 48 is connected to the copper wiring layer 46 via wiring photo via 47. The copper wiring layer 46 and the wiring photo via 45, the copper wiring layer 48 and the wiring photo via 47 are integrally formed of a copper by the electroplating process after depositing nickel or copper as a base, respectively. The upper layers of the copper wiring layer 46 and 48 are respectively laminated with the thin film type photosensitive resin, and heat-treated to fill the inside of the wiring photo vias 45 and 47 with the photosensitive resin and flatten the entire surface. Incidentally, the wiring photo vias 44*a* and 44*c* having different depths are deeper than the wiring photo via for the simple multilayered wiring of the upper layer. The upper layer of the copper wiring layer 44 is also laminated with the thin film type photosensitive resin, and heat-treated to fill the inside of the wiring photo vias 44*a* and 44*c* with the photosensitive resin, and the entire surface is flattened. The copper films of the wiring photo vias 44*a* and 44*c* having via diameters of several tens of micrometers may be damaged by the effect of temperature fluctuations due to the manufacturing process and the temperature environment during the operation of the products. The concentration point of the thermal stresses acting on the wiring photo vias 44*a* and 44*c* due to the temperature fluctuations is the end of the bottom of the via and the upper end of the via. However, the photosensitive resin (silicone-based or bismaleimide-based resin) used in the present embodiment has a higher coefficient of thermal expansion CTE but a lower Young's modulus (soft) than the other insulating resins (polyimide, epoxy resin, etc.), so that the binding force acting on the copper films of the wiring photo vias 44*a* and 44*c* is small, and the shearing force is not generated to the extent that the copper film is damaged. It has been demonstrated that the deeper via length, the higher thermal stresses applied to the edges of via bottoms, but no damage occurs up to about 180 μm to 200 μm. For example, when polyimides or epoxy resins have a low thermal expansion and a high Young's modulus (hard), the binding force exerted on the copper film of the wiring photo via becomes high, and the possibility of damaging the copper film becomes high, so that practical verification is required. It has also been confirmed that the thermal stress caused by the copper wiring per se is higher than that caused by photosensitive resins, and the effect of this thermal stress is particularly large at the upper end of via. However, in the case of the copper wiring in the field of semiconductor packaging, the upper end of the via is not damaged by a via length of about 180 μm to 200 μm.

An insulating layer 54 made of a solder resist or other insulating film is formed on the surface (upper surface) of the photosensitive resin layer 21 opposite to the base substrate. The re-distribution layer 42 is exposed in the area where the insulating layer 54 does not exist. The copper wiring layer 48 of the re-distribution layer 42 exposed from the insulating layer 54 functions as an external connection terminal 49. A plurality of solder balls 51 is arranged on the plurality of external connection terminals 49. That is, the re-distribution layer 42 may be connected to an external substrate or the like through the plurality of solder balls 51 connected to the external connection terminal 49.

Figure 2:
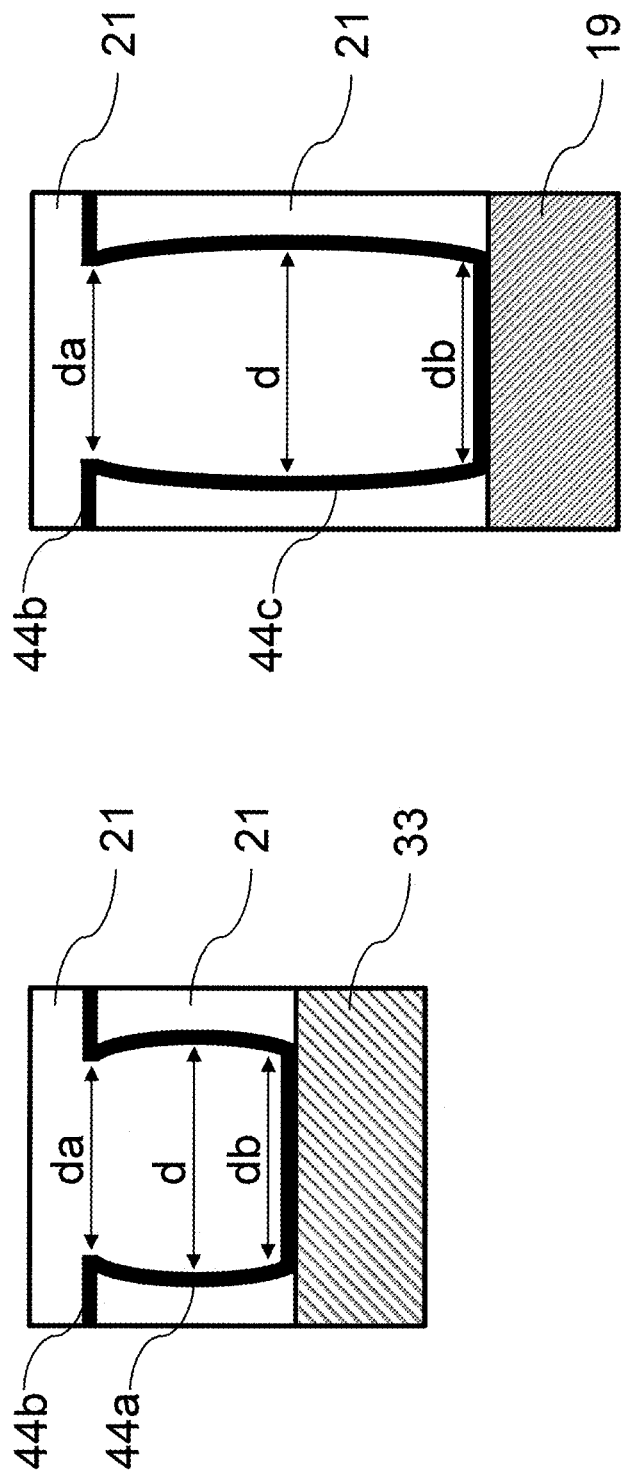
FIG. 2 is an enlarged cross-sectional view of a semiconductor device according to an embodiment of the present invention.

The structures of the wiring photo via 44*a* and 44*c* will be described in more detail with reference to FIG. 2. The structures of the wiring photo via 44*a* and 44*c* is basically the same. In FIG. 2, the structure of the wiring photo via 44*a* on the chip 33 shown in the region A of FIG. 1 is shown in detail on the left side, and the structure of the wiring photo via 44*c* on the wiring layer 13 shown in the region B of FIG. 1 is shown in detail on the right side with reference to an enlarged cross-sectional view.

As shown in FIG. 2, the wiring photo via 44*a* and 44*c* have a barrel shape (cup shape) in which the bottom part connected to the connection part of the chip 33 or the connection part of the wiring layer 13 and the side wall are continuous, and continuous with the wiring 44*b* arranged at the top. In the cross-sectional view, the wiring photo via 44*a* and 44*c* include a portion having a large distance d between the side walls at the intermediate part between the bottom part and the upper part, and a portion having a small distance da between the side walls at the upper side of the intermediate part. That is, the upper hole surface of the wiring photo via 44*a* and 44*c* is narrower than that of the hole surface of the intermediate part. Here, the hole surface indicates the inner surface of the wiring photo via 44*a* and 44*c* in a cross section substantially parallel to the substrate 11. In FIG. 2, the side wall of the wiring photo via 44*a* or 44*c* and the wiring 44*b* arranged at the upper part are connected at an acute angle toward the inside of the wiring photo vias 44*a* or 44*c*. However, it is preferred that the side wall of the wiring photo via 44*a* or 44*c* and the wiring 44*b* are connected with a gently continuous curved surface. Since the distance da between the side walls on the upper part of the wiring photo via 44*a* and 44*c* is smaller than the distance d between the side walls in the middle part, It is possible to prevent the wiring photo vias 44*a* and 44*c* from coming out from the via holes 43 and 41 due to thermal stress due to fluctuations in temperature, impact, and vibration. That is, It is possible to prevent the connection portion between the connection part of the chip 33 and the wiring photo via 44*a*, and the connection part of the wiring layer 13 and the wiring photo via 44*c* from peeling off or falling off, and it is possible to improve the connection reliability of the respective connection portion. Further, by connecting the sidewall of the wiring photo via 44*a* or 44*c* and the wiring 44*b* with a gently continuously curved surface, it is possible to relax the stress concentration on the connection part between the sidewall of the wiring photo via 44*a*, 44*c* and the wiring 44*b*.

The wiring photo via 44*a* and 44*c* further include a portion having a small distance db between the side walls at the bottom side of the middle part, and the side wall and the bottom are connected with a gently continuous curved surface. Since the distance db between the side walls at the bottom side of the wiring photo via 44*a* or 44*c* is smaller than the distance d between the sidewalls at the intermediate part, wiring defects can be suppressed when forming the wiring photo vias 44*a* and 44*c* described later, and the connection reliability between the wiring photo vias 44*a* or 44*c* and the connection part of the chip 33 or the wiring layer 13 can be improved. However, the present invention is not limited to this, and the side wall and the bottom part of the wiring photo via 44*a* and 44*c* may be connected at an acute angle toward the outside. That is, the wiring photo vias 44*a* and 44*c* may cut deep into the photosensitive resin layer 21 outside from the bottom of the via holes 43 and 41 due to the stress of plating. Since the wiring photo vias 44*a* and 44*c* cut deep into the photosensitive resin layer 21 at the bottom part, It is possible to prevent the wiring photo vias 44*a* and 44*c* from coming off from the via holes 43 and 41 due to thermal stress due to fluctuations in temperature, and the connection reliability between the wiring photo vias 44*a* or 44*c* and the connection portion of the chip 33 or the wiring layer 13 can be improved.

Since all of the wiring photo via 44*a* and 44*c* connected to the wiring 44*b* are formed in the same exposure process, the structure is basically the same although there is a difference in depth. The wiring photo via 44*a* and 44*c* located near the chip 33 are easily affected by thermal stress due to the difference in the coefficient of thermal expansion between the chip 33 and the photosensitive resin layer 21. Further, the wiring photo via 44*a* on the chip 33 is easy to come off even in an impact or vibration because it is shallow, and it remarkably appears on the chip 33 having a small pitch and a small connection area. Therefore, by having a structure of the wiring photo via 44*a* and 44*c* according to the present embodiment, it is possible to improve the connection reliability of the connection part of the wiring photo via 44*a* and the chip 33, or the wiring photo via 44*c* and the wiring layer 13.

This wiring photo via 44*a*, 44*c*, 45, 47 are in the positions that do not overlap the outer peripheral end of the chip 33.

Figure 3:
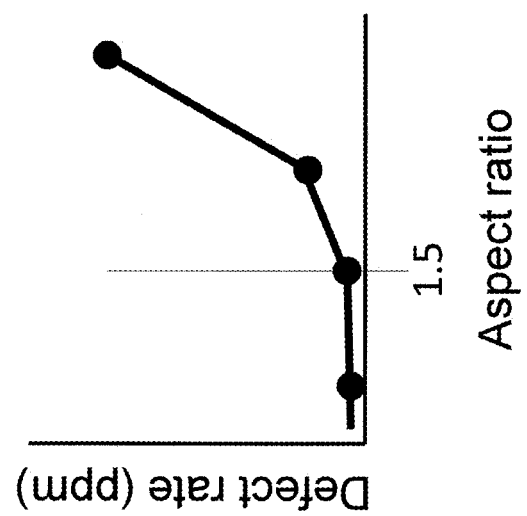
FIG. 3 is a diagram showing a reliability of the semiconductor device according to an embodiment of the present invention.

A plurality of via holes 41 and via holes 43 formed in the photosensitive resin layer 21 are the photo vias formed by selectively irradiating the photosensitive resin with light and dissolving and removing the resin through a development process. The via holes of the wiring photo via 45 and 47 connecting the copper wiring layers 44, 46 and 48 are also photo via. Since the surface on which the connection pads of the chip 33 are formed, and the copper wiring layer 19 of the wiring layer 13 in the base substrate have different heights from the upper surface of the photosensitive-resin layer 21, the depth of the opening of the via hole 43 and the via hole 41 is different. The aspect ratio of the via hole 43 and the via hole 41 is also different. The aspect ratio of the via hole 43 is smaller than the aspect ratio of the via hole 41. Further, the aspect ratio of the via hole 43 is 1.5 or less. As shown in FIG. 3, as the aspect ratio of the via hole is smaller, the defect rate of the wiring photo via formed in the via hole is suppressed. Therefore, since the aspect ratio of the via hole 43 is 1.5 or less, the connection reliability of the wiring photo via 44*a* arranged on the via hole 43 is improved. Here, the aspect ratio of the via hole 43 and via hole 41 is defined as the aspect ratio obtained by dividing the height of the opening by the largest diameter of the bottom opening end. Since the wiring photo via 44*a* or the wiring photo via 44*c* is inscribed with an extremely thin copper film (about 2 μm to 10 μm) in the via hole 43 or the via hole 41, the thickness of the copper film does not affect the aspect ratio of the wiring photo via 44*a* or the wiring photo via 44*c*.

The number of the connection pad included in the semiconductor chip mounted on the FOWLP is overwhelmingly larger than the number of the three-dimensional wiring photo via connecting the wiring layer 13 in the base substrate and the re-distribution layer 42. That is, the number of the via hole 43 arranged on the surface on which the connection pads of the chip 33 are formed is larger than the number of via hole 41 arranged on the wiring layer 13 in the base substrate. For example, the number of the via hole 43 arranged on the surface on which the connection pads of the chip 33 are formed is about 200 to 10,000. On the other hand, the via hole 41 arranged on the wiring layer 13 in the base substrate forms a part of the wiring composed of the wiring layer 13 in the base substrate and the re-distribution layer 42, and the number of the via hole 41 is about 20 to 200. Therefore, by setting the aspect ratio of the large number of via holes 43 to 1.5 or less, the connection reliability of the wiring photo via 44*a* can be improved, and the overall connection reliability can be improved. On the other hand, although it is desirable that the aspect ratio of the small number of via hole 41 is 1.5 or less, if multiple wiring paths are arranged, the entire connection reliability can be maintained, so that the connection can be handled even if the aspect ratio is slightly increased. With such configuration, the reliability of the semiconductor device 40 can be improved and the density of the wiring can be increased. As will be described later, the via hole 43 and the via hole 41 are formed in the same process.

With the above configuration, a part of the connection pads of the chip 33 are electrically connected to the solder ball 51 through the redistribution layer 42, and another part of the connection pads are electrically three-dimensionally connected to the copper wiring layers in the wiring layer 13 in the base substrate through the copper wiring layer 44 passing through the via hole 41.

Next, a method of manufacturing semiconductor device according to the embodiment will be described with reference to FIGS. 4 and 5.

Figure 4:
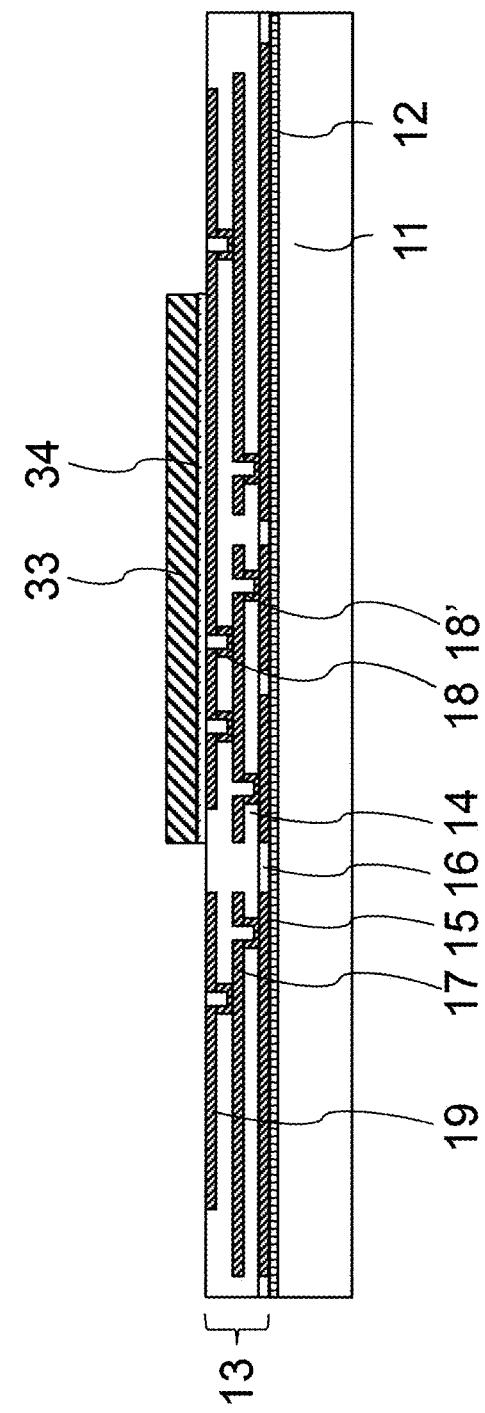
FIG. 4 is a cross-sectional view showing a method of manufacturing the semiconductor device according to an embodiment of the present invention.

As shown in FIG. 4, the base substrate in which the wiring layer 13 is formed on the rigid substrate 11 through the release layer 12 is prepared. This base substrate is similar to that shown in FIG. 1.

On the wiring layer 13, the chip 33 is fixed at a distance. The thickness of the chip 33 is usually 100 μm or less and is generally about 70 μm in many cases. The surface on which the integrated circuit is formed (the surface on which the connection pads are formed) of the chip 33 corresponds to the upper surface in the figure.

Figure 5:
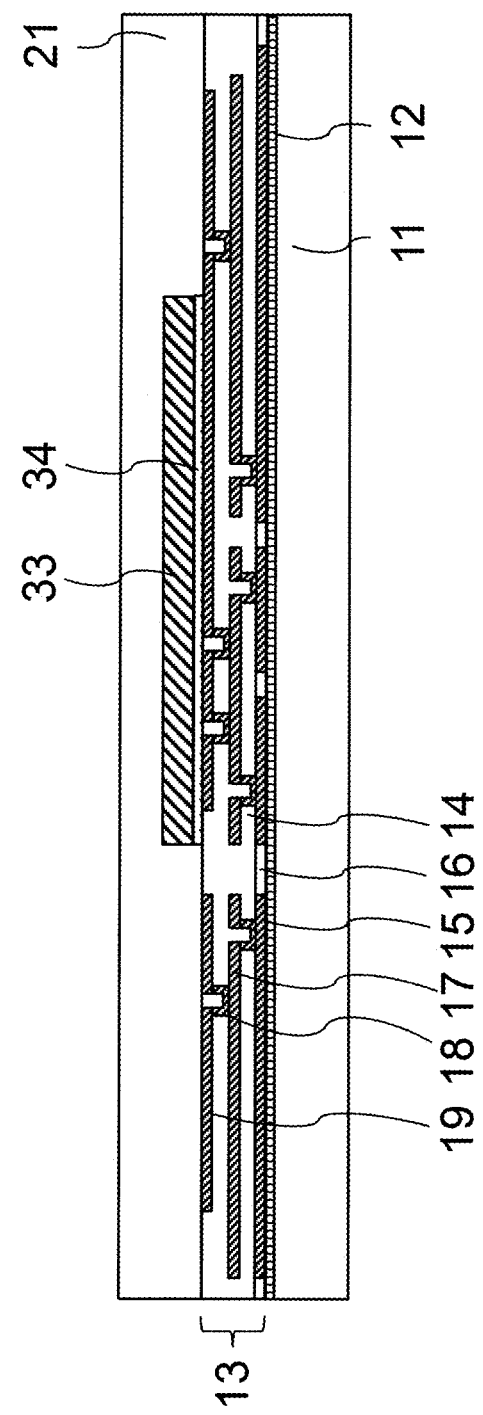
FIG. 5 is a cross-sectional view showing a method of manufacturing the semiconductor device according to an embodiment of the present invention.

As shown in FIG. 5, the photosensitive resin layer 21 made of the photosensitive resin is formed on the chip 33 fixed on the wiring layer 13. The thickness of the photosensitive resin layer 21 is less than 200 μm, and after lamination, it is 10 μm to 50 μm thicker than the thickness of the chip 33. If the thickness of the chip 33 is 70 μm, the photosensitive resin layer 21 is about 100 μm. The material of the photosensitive resin is not particularly limited but is formed by vacuum lamination of a dry film. First, the film type photosensitive resin is laminated on the chip 33 (evacuating after the film type photosensitive resin is temporarily bonded onto the chip 33 at 100° C.), and the raised portion on the chip 33 is flattened by a simple press (flattened at 60° C. for about 5 minutes) and pre cured (at 100° C. for about 5 minutes). The insulating photosensitive resin is composed of a silicone-based or bismaleimide-based resin or a soft polymer material. Since the photosensitive resin is embedded so as to cover the chip 33, it is desirable that the elastic modulus (Young's Modulus) of the photosensitive resin is equal to or less than 1 GPA at room temperature and equal to or less than 0.1 GPA at 125° C. When the photosensitive resin layer 21 is a silicone-based resin, the elastic modulus of the silicone-based resin can be set within the above ranges by appropriately adjusting the cross-link densities and the lengths of the molecular chains. Since the general epoxy encapsulant is a few dozen GPAs at normal temperature, materials with a considerably low elasticity coefficient will be used. As the photosensitive resin layer 21, known photosensitive resin materials can be used as long as the above condition is satisfied. If the elastic modulus becomes equal to or higher than 1 GPA at room temperature or equal to or higher than 0.1 GPA at 125° C., the chip 33 becomes difficult to be embedded, and thus, disturbances such as voids, delamination, and chip damage at the time of embedding tend to occur.

The photosensitive resin layer 21 is formed by vacuum lamination using the dry film, whereby the upper surface (the surface opposite to the substrate 11) can be formed substantially flat. However, the upper surface of the photosensitive resin layer 21 (the surface opposed to the substrate 11) may be slightly raised at the position where the chip 33 is arranged, and the upper surface of the photosensitive resin layer 21 may have a small step along the outer peripheral edge of the chip 33. In the planarization process, even if this small step is generated, it is controlled to be several microns or less (the wiring widths or less).

The photosensitive resin layer 21 has a small step in the region overlapping with the outer peripheral edge of the chip 33. The re-distribution formed upward so as to straddle the step is affected by the height of the step, and the possibility of disconnection increases if the wiring width is narrowed. In order to suppress the possibility of disconnection, in terms of reliability, it is preferable that the wiring width to be wide and the step to be controlled to be low.

Figure 6:
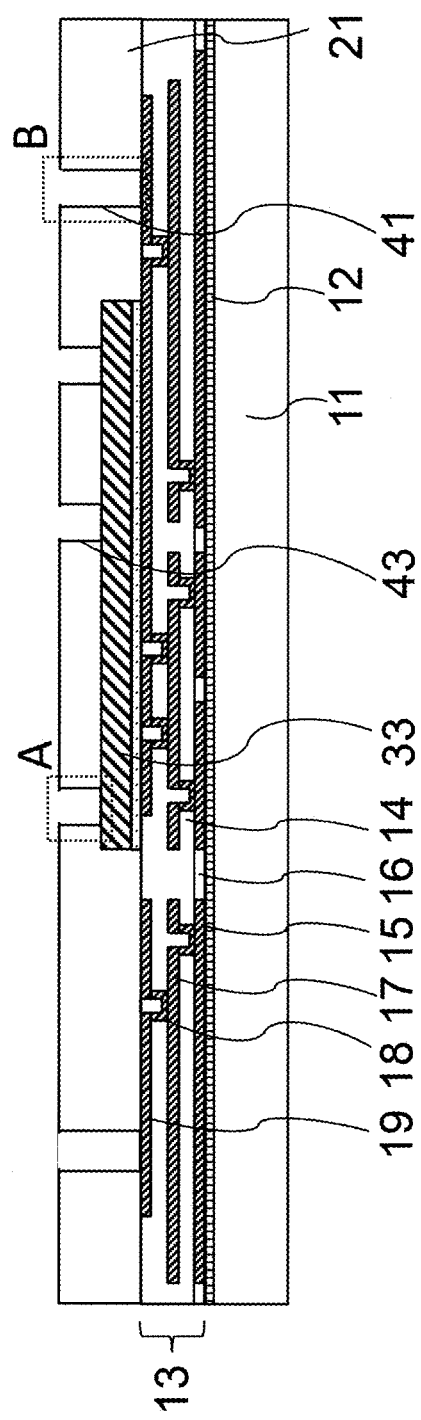
FIG. 6 is a cross-sectional view showing a method of manufacturing the semiconductor device according to an embodiment of the present invention.
Figure 7:
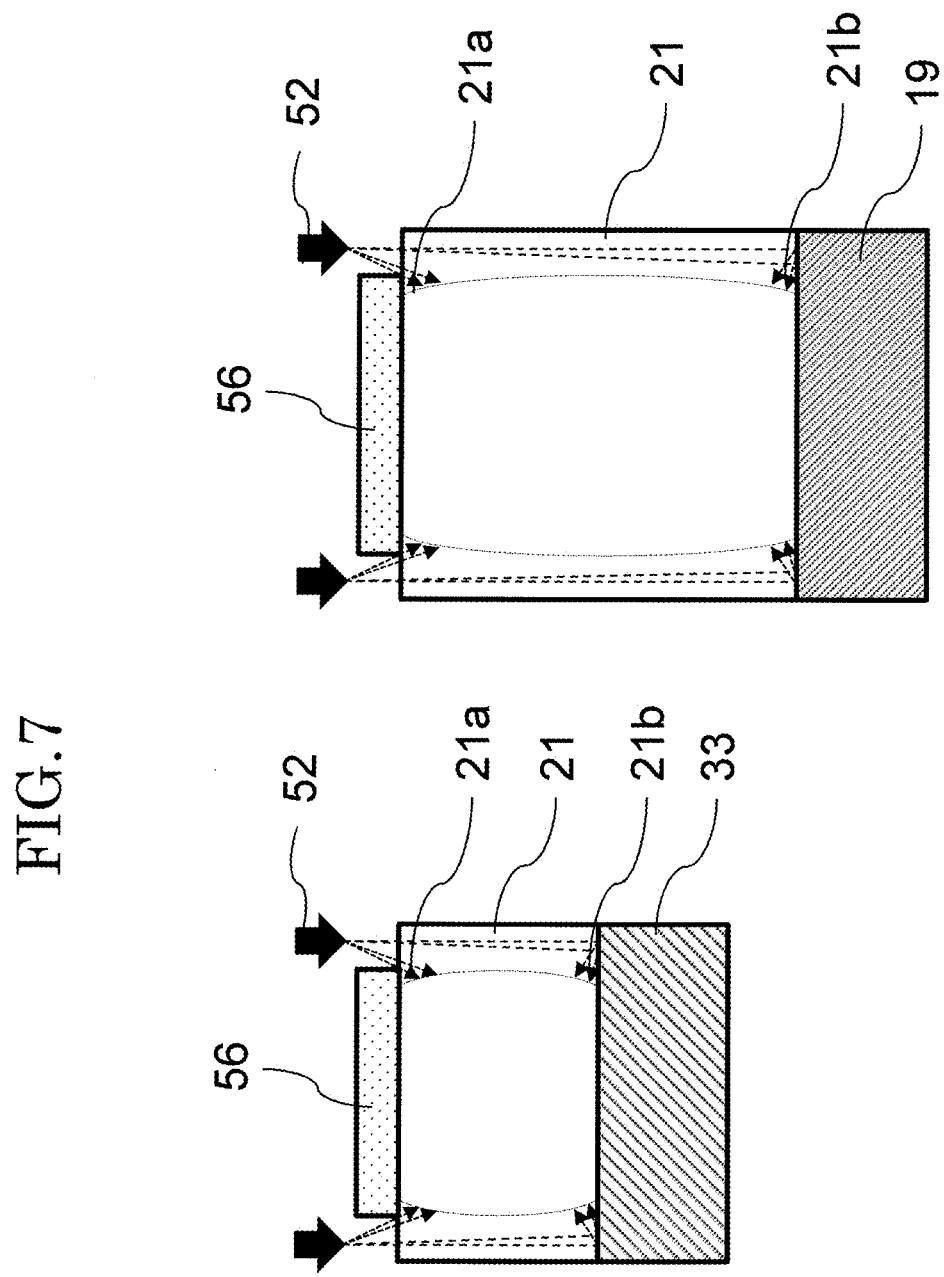
FIG. 7 is an enlarged cross-sectional view showing a method of manufacturing the semiconductor device according to an embodiment of the present invention.
Figure 8:
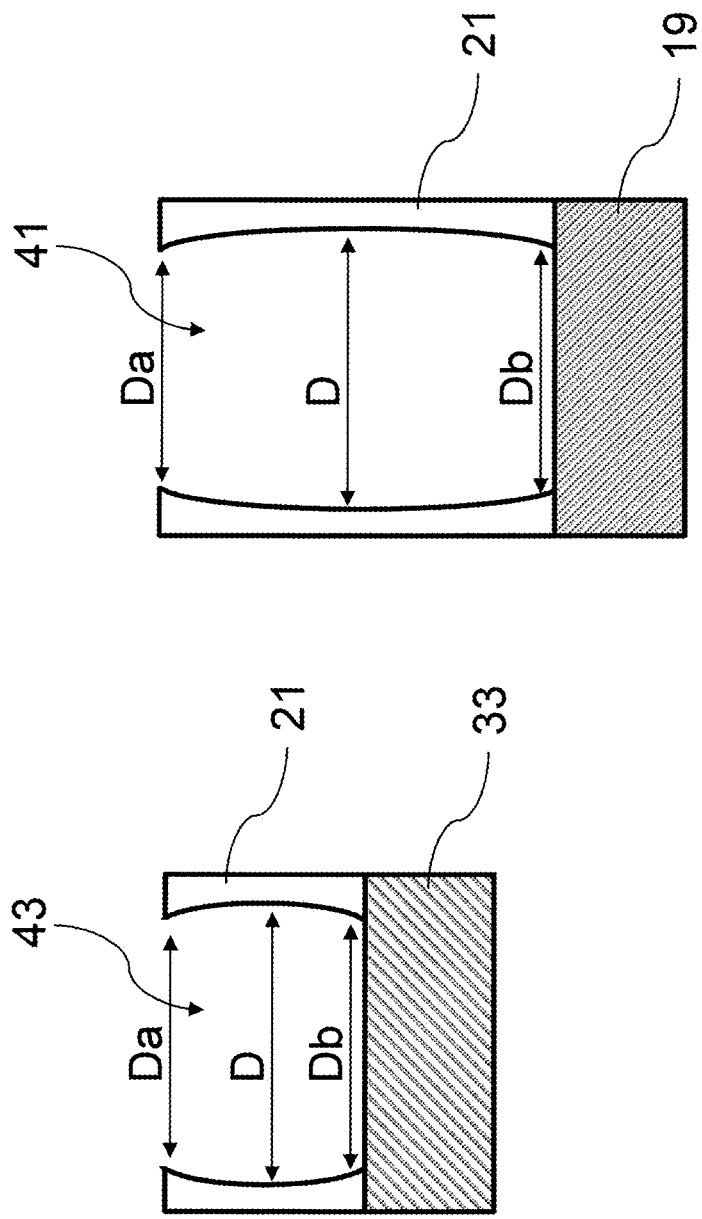
FIG. 8 is an enlarged cross-sectional view showing a method of manufacturing the semiconductor device according to an embodiment of the present invention.

Next, as shown in FIG. 6, first, the via hole 43 for exposing the connection pad which is part of the chip 33, and the via hole 41 for exposing the connection part of the copper wiring layer 19 of the re-distribution layer in the base substrate 13 are formed on the flattened photosensitive resin layer 21. The via hole 43 and the via hole 41 are formed in the same manner. In FIGS. 7 and 8, the method of manufacturing the via hole 43 on the chip 33 shown in the region A of FIG. 6 is shown in detail on the left side, and the method of manufacturing the via hole 41 on the copper wiring layer 19 shown in the region B of FIG. 6 is shown in detail on the right side with reference to an enlarged cross-sectional view.

The flattened photosensitive resin layer 21 is temporarily heated to such an extent that it is not completely cured (pre-cured), and thereafter, as shown in FIG. 7, UV light 52 is selectively irradiated and exposed toward the photosensitive resin layer 21 from the photosensitive resin layer 21 side of the chip 33 fixed on the wiring layer 13 in the base substrate. The UV light 52 is generated by a metal halide lamp or a high-pressure mercury lamp, and the photosensitive resin layer 21 is selectively irradiated with the ultraviolet rays 52 through an opening of a stencil mask 56 disposed on the photosensitive resin layer 21. The photosensitive resin layer 21 located below the opening of the stencil mask 56, is exposed to ultraviolet rays 52. The distance between the upper surface of the photosensitive resin layer 21 and the stencil mask 56 may be, for example, 0 μm or more and less than 10 μm in the case of an aligner, and the distance may be 10 cm or more and less than 20 cm in the case of a stepper.

In this embodiment, the photosensitive resin is photosensitive at an exposure amount of 800 mJ/cm$^2$ or more and 2000 mJ/cm$^2$ or less. More preferably, the photosensitive resin is photosensitive at an exposure amount of 800 mJ/cm$^2$ or more and 1600 mJ/cm$^2$ or less. The via hole 41 and the via hole having different depths can be collectively formed by collectively exposing with one mask at an exposure amount within the above ranges. In other words, in this embodiment, the photosensitive resin is exposed to an extent that the via hole 41 can be formed, that is, an excessive exposure amount to form the via hole 43. It is desirable that the photosensitive resin has a light transmittance of 85% or more at a wavelength of 350 nm or more. Here, the light transmittance of the photosensitive resin was calculated by forming a 15 μm-thick resin film on a glass substrate and curing it, and calculating the transmittance from the amounts of light absorbed and transmitted at the respective wavelengths. When the photosensitive resin is a silicone-based resin, the light transmittance can be set within the above range by appropriately adjusting the crosslink density, the length of the molecular chain, and the like. By setting the exposure amount and the light transmittance of the photosensitive resin of the photosensitive resin layer 21 within the above ranges, the via hole 41 and the via hole 43 having the shapes described later can be collectively formed.

When the exposure amount of the photosensitive resin layer 21 is 800 mJ/cm$^2$ or more, a part of the UV rays 52 circulate to a photosensitive resin layer 21a below the stencil mask 56, and the upper portion of the photosensitive resin layer 21a near the outer end of region shielded by the stencil mask 56 is also irradiated in excess. That is, the upper portion of the photosensitive resin layer 21a located below the region which is shielded by the stencil mask 56, is also exposed to the extra UV light 52. By such exposure method, the via hole 43 and 41 to be described later can be formed in a barrel-shaped including a portion having a large distance D between the sidewalls (the distance of the hole surface) at the intermediate part between the bottom part and the upper part, and a portion having a small distance Da between the sidewalls at the upper side than the intermediate part.

When the exposure amount of the photosensitive resin layer 21 is 2000 mJ/cm$^2$ or less, it is possible to suppress excessive exposure of the upper portion of the photosensitive resin layer 21a in the vicinity of the outer end of region shielded by the stencil mask 56. By such exposure methods, the upper portion of the opening of the via hole 43 and 41, which will be described later, are connected with a gently continuous curved surface, and it is possible to relax the stress concentration on the connection part between the sidewall of the wiring photo via 44a, 44c and the wiring 44b. Depending on the selected resins, the via hole 43 may be formed in a shape contracted by more than half of the via diameter of the stencil mask 56 when the overexposure becomes 2000 mJ/cm$^2$ or more, which makes it difficult to control the dimensions and raises the risk of reliability problems. The via hole 43 and the via hole 41 are preferably formed so that the distance Da between the sidewalls of the upper part are 50% or more of the via diameter of the stencil mask 56. For such dimensional control, the exposure amount of the photosensitive resin layer 21 is more preferably 1600 mJ/cm$^2$ or less. By such exposure method, it is possible to suppress excessive exposure of the upper portion of the photosensitive resin layer 21a near the outer end of the region shielded by the stencil mask 56, and the shapes and sizes of the via hole 43 and 41 to be described later can be controlled.

On the other hand, the ultraviolet ray 52 wraps around the lower portion of the photosensitive resin layer 21b below the stencil mask 56 by a part of the ultraviolet ray 52 is reflected on the upper surface of the copper wiring layer (e.g., copper wiring layer 19) of the tip 33 and the wiring layer 13, so that the lower portion of the photosensitive resin layer 21b in the vicinity of the outer end of the region shielded by the stencil mask 56 is also additionally irradiated. That is, a part of the lower portion of the photosensitive resin layer 21b, which is located below the region shielded by the stencil mask 56, is also excessively exposed by the ultraviolet rays 52. By such exposure process, the via hole 43 and 41, which will be described later, may include a part having a small distance Db between the sidewalls at the bottom part side than the intermediate part, and between the sidewall and the bottom part may be connected by a curved surface that smoothly continues.

Figure 9:
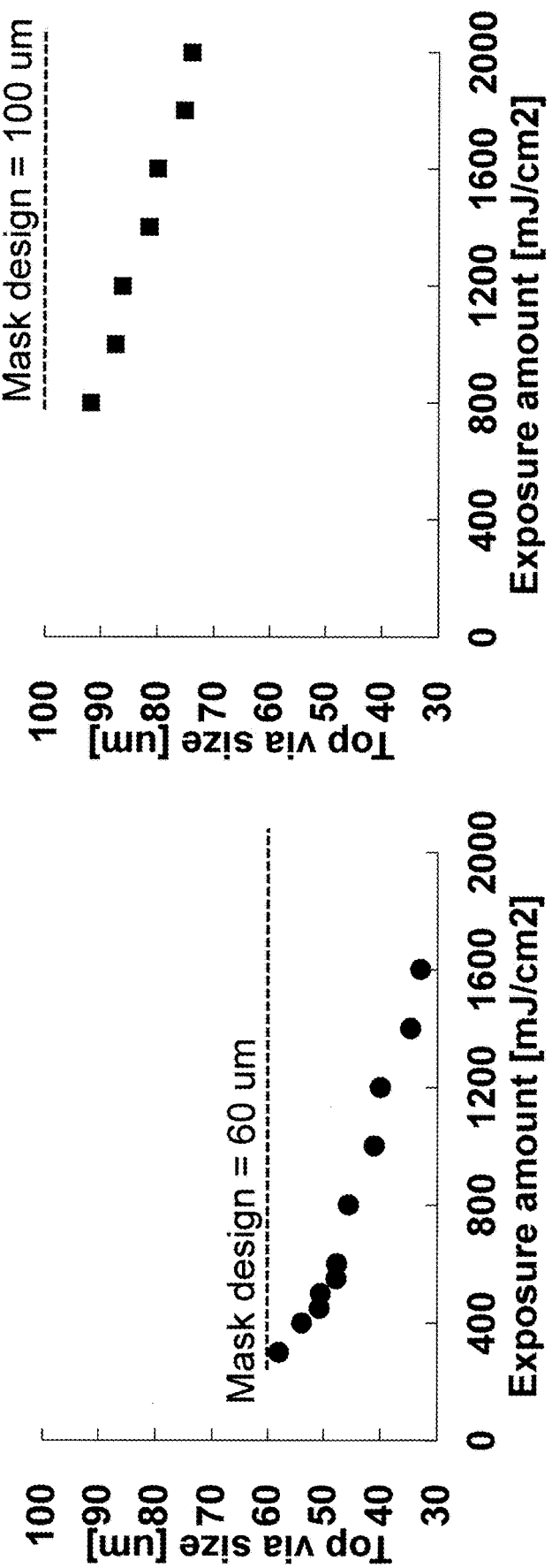
FIG. 9 is a diagram showing a relationship between an exposure amount and a dimension of a via hole of the semiconductor device according to an embodiment of the present invention.

FIG. 9 shows the relationship between the dimensions and the exposure amount of the via hole 43 on the chip 33 shown in the region A of FIG. 6 on the left side and the via hole 41 on the copper wiring layer 19 shown in the region B of FIG. 6 on the right side. On the left side of FIG. 9, the via diameter of the stencil mask 56 is set to 60 μm, the distance Da between the sidewalls at the upper side of the via hole 43 formed at the respective exposure amount are indicated by black circles. The via hole 43 can be formed at 400 mJ/cm$^2$ or more, and the distance Da between the side walls at the upper side was 34 μm when exposed at 1600 mJ/cm$^2$. If Da is formed at 50% or less of the mask size, the risk increases from the viewpoint of the reliability and manufacturing control problems when Da is formed at 1600 mJ/cm$^2$ or more. On the right side of FIG. 9, the via diameter of the stencil mask 56 is set to 100 μm, and the distances Da between the sidewalls on the upper side of the via hole 41 formed at the respective exposure amounts are indicated by black squares. The via hole 41 can be formed at 800 mJ/cm$^2$ or more, and the distance Da between the sidewalls at the upper side was 80 µm when exposed at 1600 mJ/cm$^2$. Da was formed in 80% of the mask dimensions. From these results, it can be seen that in the photosensitive resin of the present embodiment having a light transmittance of 85% or more at the wavelength of 350 nm or more, the exposure amount for collectively exposing the via hole 43 and the via hole 41 is preferably in a range of 800 mJ/cm$^2$ or more and 1600 mJ/cm$^2$ or less.

As shown in FIG. 8, after exposure, heat processing is performed, and the photosensitive resin that has not been selectively irradiated is dissolved and removed by the development process (developed). After rinsing, the via hole 43 and 41 of the photosensitive resin layer 21 can be formed by performing the main curing by heat treatment. By such methods of manufacturing the via hole 43 and 41, the via hole 43 and 41 in cross-sectional view can be formed in a barrel-shaped that includes a portion having a larger distance D between the sidewalls at the intermediate part between the bottom part and the upper part, and a portion having a smaller distance Da between the sidewalls at the upper side than the intermediate part. In FIG. 8, the upper part of the opening of the via hole 43 and 41 protrudes inward at an acute angle. Further, the via hole 43 and 41 in cross-sectional view may include a portion where the distance Db between the sidewalls at the bottom part is smaller than the intermediate part, and the side wall and the bottom part may be connected with a gently consecutive curved surface. However, without limitation, the difference between the distance D between the side walls at the intermediate part and the distance Da between the side walls at the upper side of the via holes 43 and 41, the difference between the distance D between the side walls in the intermediate part and the distance Db between the side walls on the lower side of the via holes 43 and 41, the shape of the top and bottom of the openings of the via holes 43 and 41 can be controlled depending on the wavelength and the exposure amount of the ultraviolet rays 52, the reflectance from the lower layer of the photosensitive resin layer 21, the photosensitive characteristic material of the photosensitive resin layer 21, the developing conditions, and the like.

The sidewall and the bottom part of the via hole 43 and 41 are connected with a gently continuously curved surface, thereby improving the effectiveness of the asher process for removing the residue and film residue remaining on the via hole 43 and 41 of the photosensitive resin layer 21. The residue and film residue causes discontinuity of the titanium (Ti)/copper (Cu) laminate thin film, which is a seed for the copper plating described later, and affects the subsequent growth of the copper plating even when the titanium (Ti)/copper (Cu) laminate thin film is successively formed on the residue and film residue. That is, by improving the removal efficiency of the residue and film residue, it is possible to improve the connection reliability of the wiring photo via 44a and the connection part of the chip 33, and the wiring photo via 44c and the wiring layer 13. Here, the residue and film residue are not limited to the photosensitive resin layer 21, and includes, for example, a photosensitive resist used for patterning wiring region. Further, the sidewall and the bottom part of the via hole 43 and 41 is connected with a gently continuous curved surface, thereby the efficiency of the film formation (wraparound) by sputtering of the titanium (Ti)/copper (Cu) laminated thin film as a seed of copper plating to be described later is improved, and the connection reliability between the wiring photo via 44a and the chip 33 and the connection between the wiring photo via 44c and the wiring layer 13 can be further improved.

Since all of the via hole 43 and 41 arranged on the same plane substantially parallel to the substrate 11 of the photosensitive resin layer 21 are formed by the same exposure process, the structures are basically the same although the depth is different. Since the via hole 41 disposed outside of the tip 33 is deep (photosensitive resin layer 21 is thick), it is particularly susceptible to the removal efficiency of the residue and film residue. Since the via hole 41 is deep, it is susceptible to the efficient of film deposition (wraparound) by sputtering of the titanium (Ti)/copper (Cu) layered thin film, which will be seeded for copper plating as described below. By having the structure of the via hole 41 according to the present embodiment, since the residue and film residue is less likely to remain and easy deposition by sputtering, it is possible to further improve the connection reliability between the connection part of the wiring photo via 44c and the wiring layer 13.

The completely cured photosensitive resin layer 21 has a Young's modulus, which is lower than that of mold resin of the semiconductor chip such as epoxy resin material by one order of magnitude, but the shapes of the formed via holes 41 and 43 are not changed unless an impact is applied thereto. At this time, the via hole 43 is formed on the connection pad of the application processor chip 33, and the opening of the via hole 41 is formed on the connection part of the wiring layer 13 substantially simultaneously.

The surface on which the connection pads are formed of the wiring layer 13 in the base substrate and the chip 33 differ in height from the upper surface of the photosensitive resin layer 21. Therefore, the aspect ratios of the via hole 43 and the via hole 41 are also different. The aspect ratio of the via hole 43 is smaller than the aspect ratio of the via hole 41. Further, it is preferable that the aspect ratio is 1.5 or less. When the chip 33 has a thickness of about 70 µm, the photosensitive resin layer 21 has a thickness of about 100 µm, the diameter of the via hole 43 is 30 µm, and the diameter of the via hole 41 is 70 µm, the aspect ratio of the via hole 43 is 1.0, and the aspect ratio of the via hole 41 is 1.42.

Figure 10:
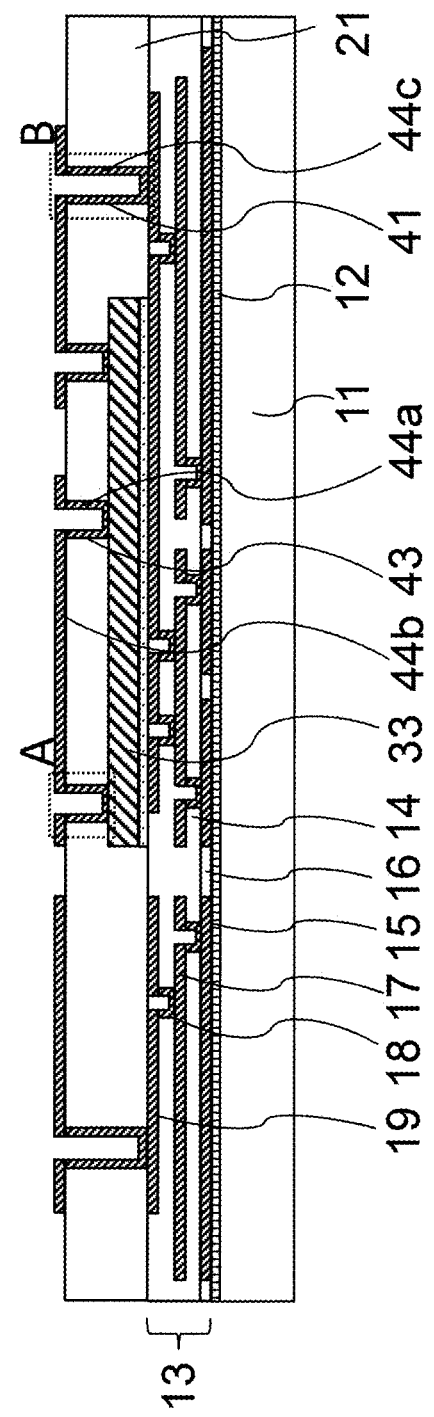
FIG. 10 is a cross-sectional view showing a method of manufacturing the semiconductor device according to an embodiment of the present invention.

As shown in FIG. 10, the copper wiring layer 44 is formed by a copper-plating process. In the present embodiment, the copper wiring layer 44 is formed by electroplating because the via hole 41 is deep. First, the titanium (Ti)/copper (Cu) thin film stacked layer serving as a copper plating seed is formed on the entire surface by sputtering. The photosensitive resist is applied over the surface and patterned to expose the wiring region. Subsequently, after copper (Cu) plating is performed using a part of the titanium (Ti)/copper (Cu) thin film stacked layer exposed by the photosensitive resist as a seed, the photosensitive resist is peeled off and the seed layer other than the copper wiring pattern is etched away, thereby forming the copper wiring layer 44. Through this process, the inner surface of the via holes 41 and 43 is also copper plated to form the wiring photo vias 44c and 44a. That is, the wiring 44b and the wiring photo vias 44c and 44a arranged on the upper surface of the photosensitive resin layer 21 are integrally formed.

The wiring photo via 44a, the wiring 44b, and the wiring photo via 44c which is integrally formed by the electrolytic plating process, are characterized in that the underlying metal is formed by sputtering and has a dense layer as compared with the non-electrolytic plating or the like. The non-electrolytic plating has a porous structure, has poor adhesion to the photosensitive resin 21, and is likely to cause a reliability problem. The wiring photo via 44*a*, the wiring 44*b*, and the wiring photo via 44*c*, which are formed on the base by an electroplating process, can form a highly adherent stacked structure on the photosensitive resin layer 21 with a substantially uniform and stable thickness reflecting the structures of the upper surface of the photosensitive resin layer 21.

Figure 11:
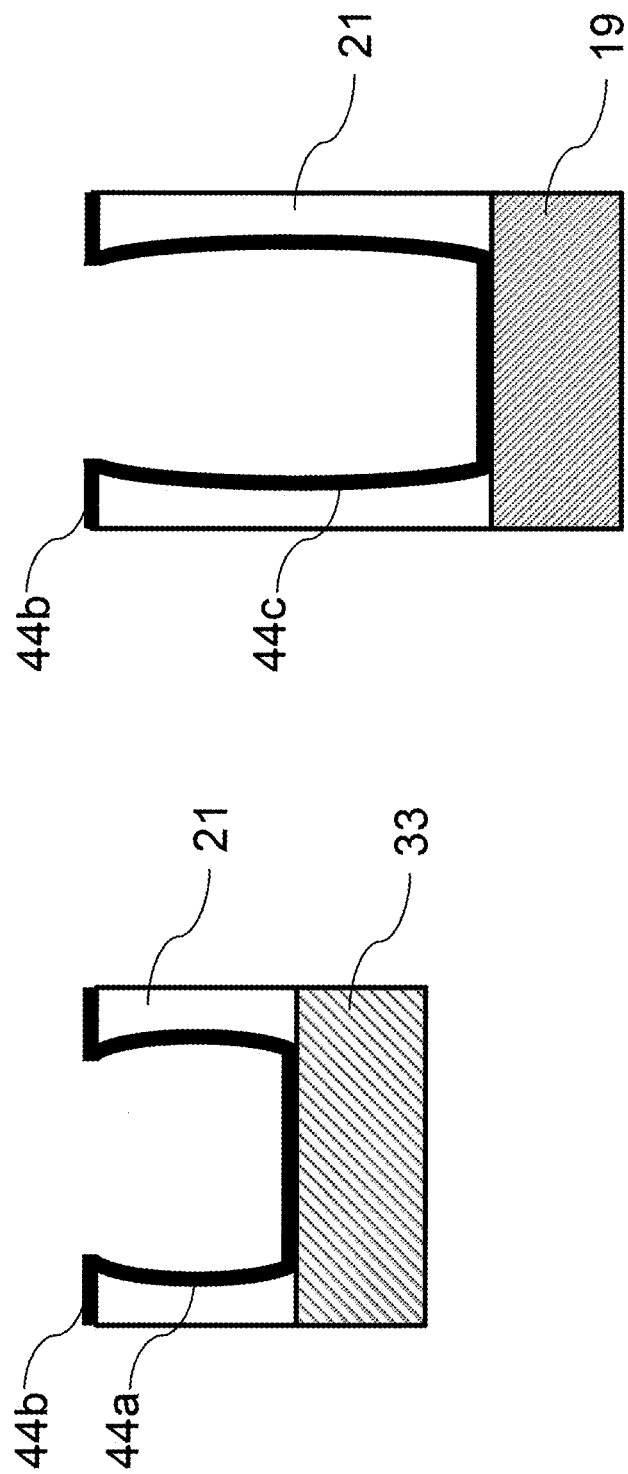
FIG. 11 is an enlarged cross-sectional view showing a method of manufacturing the semiconductor device according to an embodiment of the present invention.

The methods of forming the wiring photo via 44*c* and 44*a* are the same. In FIG. 11, the method of manufacturing the wiring photo via 44*a* and the wiring 44*b* on the chip 33 shown in the region A of FIG. 10 is shown in detail on the left side, and the method of manufacturing the wiring photo via 44*c* and the wiring 44*b* on the copper wiring layer 19 shown in the region B of FIG. 10 is shown in detail on the right side with reference to an enlarged cross-sectional view. The wiring photo vias 44*a* formed on the inner side surface and the bottom surface of the via hole 43 reflect the shape of the via hole 43. The wiring photo vias 44*c* formed on the inner side surface and the bottom surface of the via hole 41 reflect the shape of the via hole 41. Since the wiring photo via 44*a* and 44*c* has such structure, It is possible to prevent the wiring photo vias 44*a* and 44*c* from coming out of the via holes 43 and 41 due to thermal stress due to variation in temperature and impact, and vibration, and it is possible to improve the connection reliability of the connection part of the wiring photo via 44*a* and the connection part of the chip 33, and the wiring photo via 44*c* and the connection part of the wiring layer 13.

FIG. 12 is a cross-sectional photograph showing the wiring photo via 44*a* and the wiring photo via 44*c* according to the present embodiment. Both the wiring photo via 44*a* (FIG. 12, left) and the wiring photo via 44*c* (FIG. 12, right), it can be confirmed that the distance da between the sidewalls at the upper side is smaller than the distance d between the sidewalls at the intermediate part, and the distance db between the sidewalls at the bottom part side is smaller than the distance d between the sidewalls at the intermediate part. Further, in the wiring photo via 44*c* (FIG. 12, right), it can be confirmed that the wiring photo via 44*c* cut deep into the outer the photosensitive resin layer 21 from the bottom part of the via hole 41.

Figure 13:
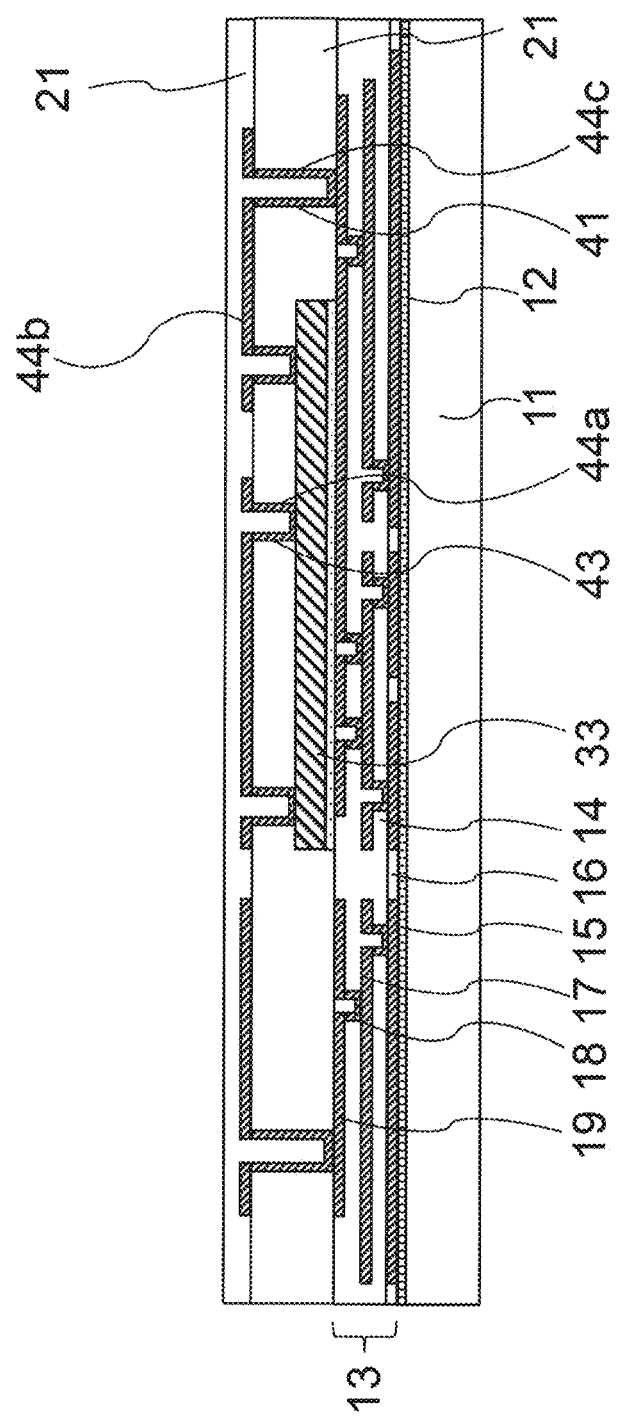
FIG. 13 is a cross-sectional view showing a method of manufacturing the semiconductor device according to an embodiment of the present invention.

As shown in FIG. 13, the photosensitive resin layer 21 made of the photosensitive resin is formed on the copper wiring layer 44. Specifically, it is formed by vacuum lamination using the film type photosensitive resin material (dry film) having a film thickness of about 15 µm. As a result, the inside of the wiring photo vias 44*a* and 44*c* is filled with the photosensitive resin, and the exposed upper surface of the photosensitive resin becomes flat. For the photosensitive resin arranged on the copper wiring layer 44, the same material system as the photosensitive resin for embedding the application processor chip 33 is used. Since the final film thickness is about 5 µm, it is also possible to spin coat or slit coat a liquid photosensitive resin material of a type different from the photosensitive resin material according to the present embodiment.

Figure 14:
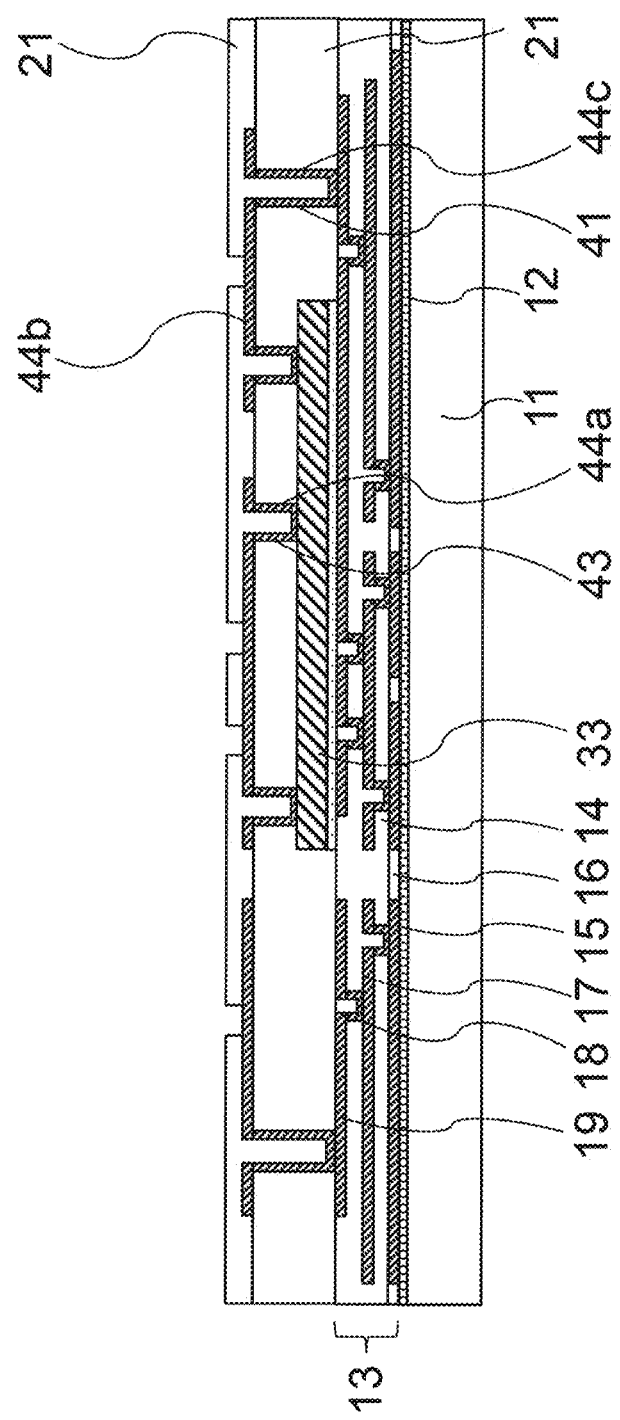
FIG. 14 is a cross-sectional view showing a method of manufacturing the semiconductor device according to an embodiment of the present invention.
Figure 15:
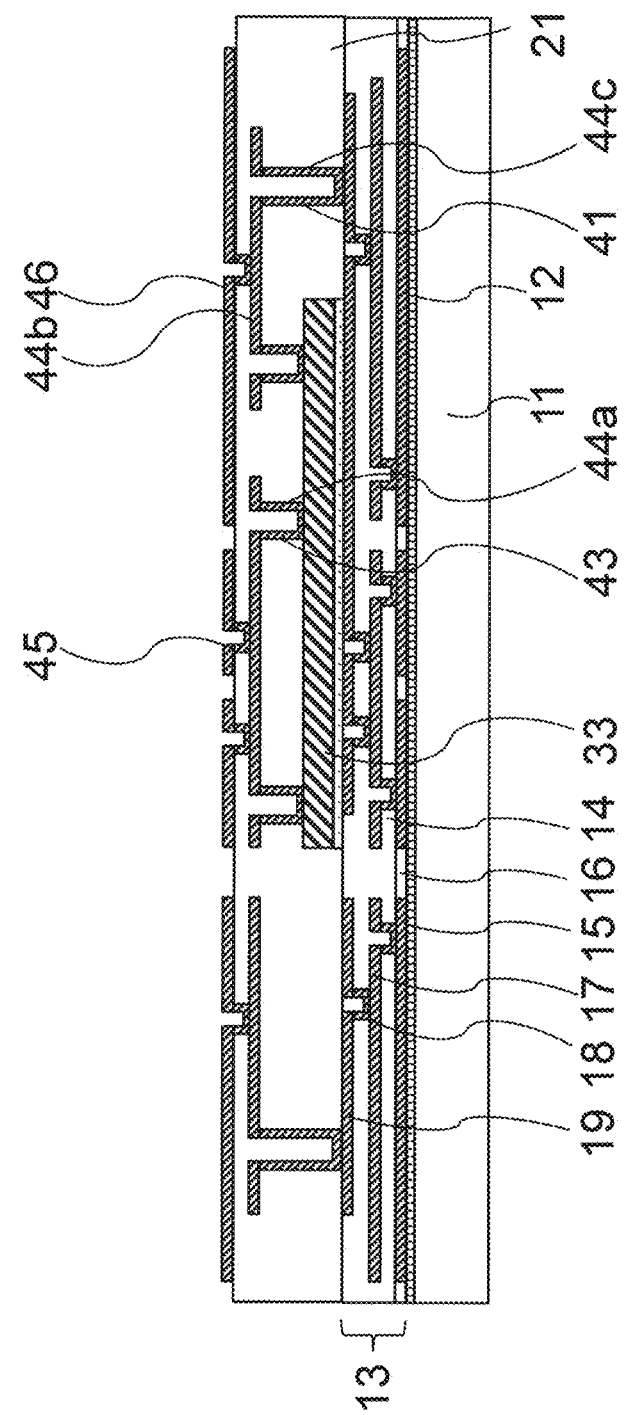
FIG. 15 is a cross-sectional view showing a method of manufacturing the semiconductor device according to an embodiment of the present invention.

As shown in FIG. 14, the via hole for the wiring photo via 45 is formed in the photosensitive resin layer 21 on the copper wiring layer 44 through the process of pre curing, exposure, development, and main curing. The wiring photo via 45 is formed by a subsequent copper-metallization process. As shown in FIG. 15, the copper wiring layer 46 is also formed by repeating the same process as the copper wiring layer 44.

Figure 16:
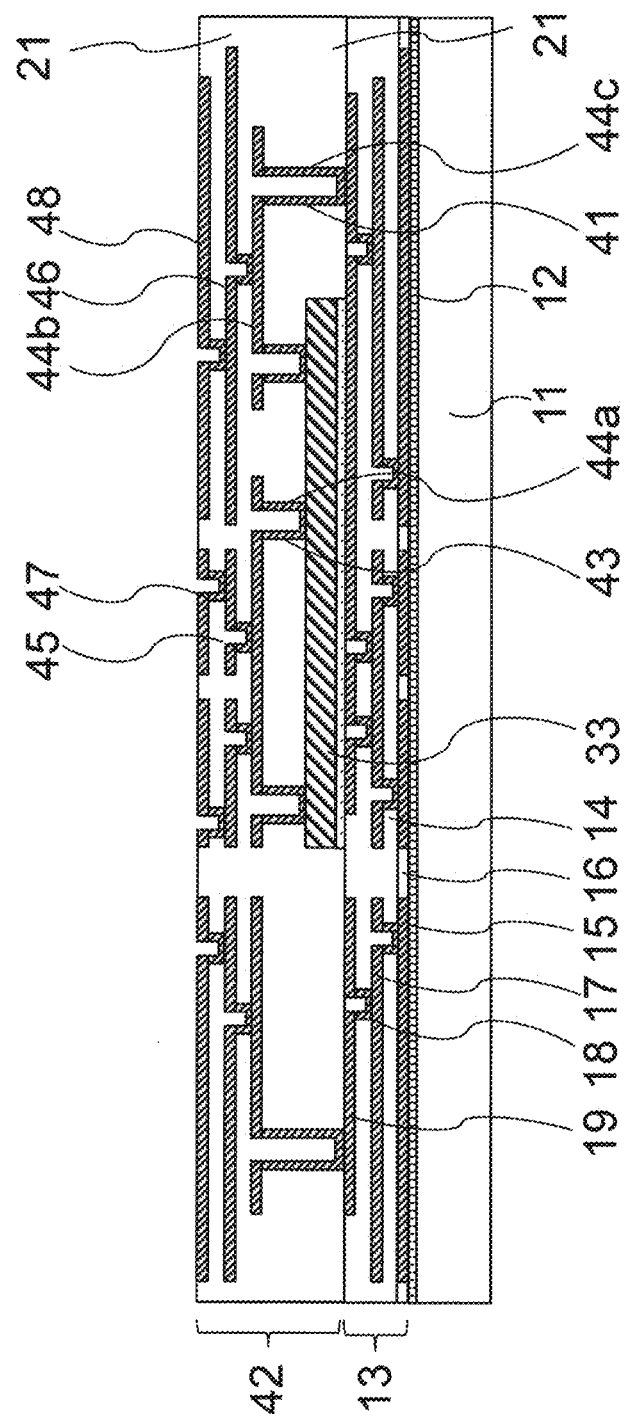
FIG. 16 is a cross-sectional view showing a method of manufacturing the semiconductor device according to an embodiment of the present invention.

As shown in FIG. 16, the photosensitive resin layer 21 made of the photosensitive resin is further formed on the copper wiring layer 46. Specifically, it is formed by vacuum lamination using the film type photosensitive resin material (dry film) having a film thickness of about 5 µm to 10 µm. As a result, the inside of the wiring photo via 45 is filled with the photosensitive resin, and the exposed upper surface of the photosensitive resin becomes flat. It is preferable to use the same material system for the photosensitive resin arranged on the copper wiring layer 46 as the photosensitive resin that embeds the application processor chip 33. Since the final film thickness is about 5 µm to 10 µm, it is also possible to spin coat or slit coat the liquid photosensitive resin material of a type different from the photosensitive resin material according to the present embodiment. The wiring photo via 47 and the copper wiring layer 48 of the re-distribution layer 42 are also formed by repeating the same process. By using the same photosensitive resin, each layer is multilayered by bonding without a boundary layer, and the photosensitive resin layer 21 is integrated. Note that even in the case of a different type of liquid photosensitive resin system, since each layer is thin, the bonding is somewhat weakened, but the interlayer bonding capable of securing a predetermined quality is possible.

In this manner, the chip 33 and the wiring layer 13 in the base substrate can be connected to the re-distribution layer 42 using wiring photo via 44*c*, 44*a* having different depths in an inexpensive fabrication process.

Figure 17:
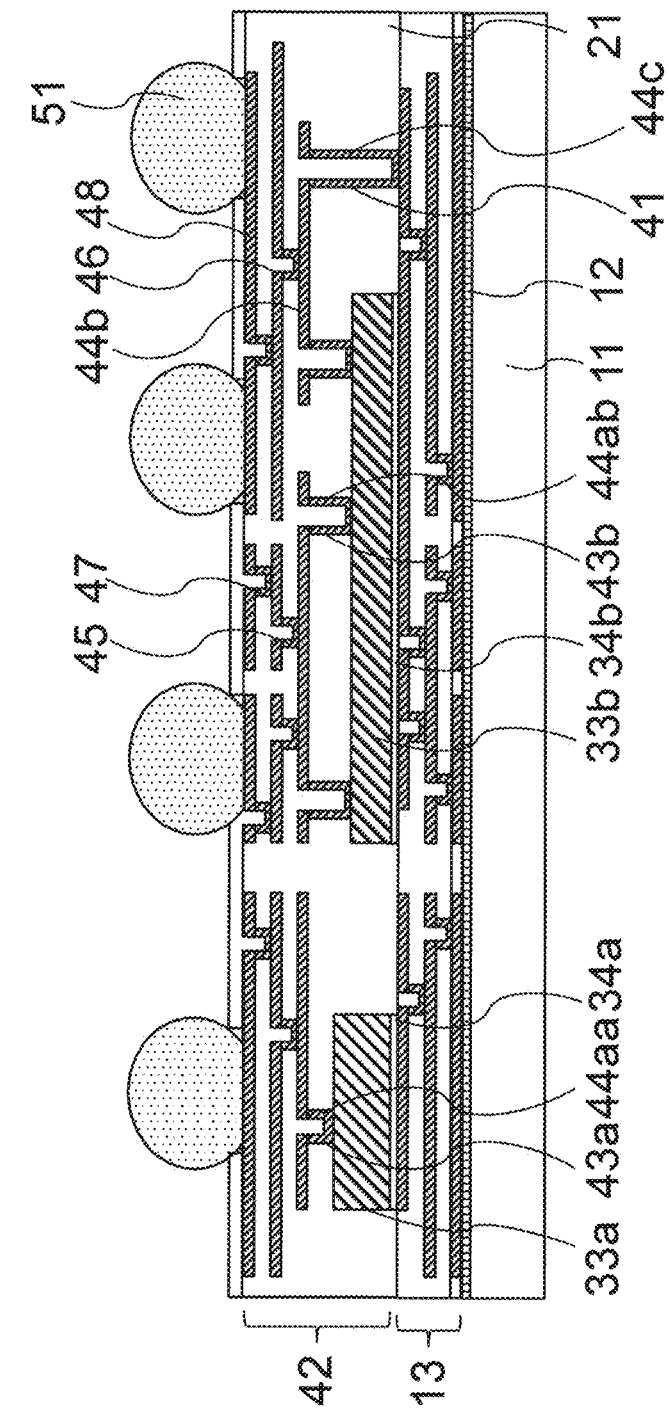
FIG. 17 is a cross-sectional view of a semiconductor device according to a modified example of the present invention.

A cross-sectional view of a semiconductor device 40A' according to another embodiment of the present invention is shown in FIG. 17. In this embodiment, different semiconductor chips of two sizes of application processor chip 33*a* and 33*b* are Face-Up fixed to the wiring layer 13 via an adhesives 34*a* and 34*b*. The manufacturing process is the same to the above-described embodiment, but the depths of the via hole 43*a* and 44*b* exposing the connection pad of the chip 33*a* and 33*b* are different, and the depths of a wiring photo via 44*aa* and 44*ab* arranged on the inner surface and bottom surface of these the via hole 43*a* and 44*b* are different because the chip thicknesses of the chip 33*a* and 33*b* are different. The copper wiring layers 44 include the wiring photo via 44*aa* (first wiring photo via) and wiring photo via 44*ab* (third wiring photo via) arranged on the inner surface and the bottom surface of the via holes 43*a* and 43*b*, and the wiring 44*b* arranged substantially parallel to the surfaces on which the connection pad of the chip 33*a* and the chip 33*b* are formed. The wiring 44*b* is arranged substantially parallelly between the surface (lower surface) of the photosensitive resin layer 21 on the base substrate side and the surface (upper surface) opposite to the base substrate side. In the present embodiment, wiring photo vias 44*aa* and 44*ab* arranged on the inner surface and the bottom surface of the via holes 43*a* and 43*b* and the wiring 44*b* are integrally formed and electrically connected to each other in the depth direction which is not shown in the figure. With this configuration, the chips 33*a* and 33*b* are electrically connected to each other through the copper wiring layer 44 in the re-distribution layer 42.

Since the depths of the via holes 43*a* and 43*b* are different, the aspect ratios of the via holes 43*a* and 43*b* are also different, but the aspect ratio is preferably 1.5 or less. When the aspect ratio of the via hole 43*a* and the via hole 43*b* are 1.5 or less, the connection reliabilities of the wiring photo via 44*aa* and 44*ab* arranged in the via hole 43*a* are improved. Since the wiring photo via 44*aa* or 44*ab* is inscribed in the via hole 43*a* or 43*b*, the aspect ratio of the wiring photo via 44*aa* or 44*ab* is substantially the same as the aspect ratio of the via hole 43*a* or 43*b*. The via holes 43*a* and 43*b* can be formed in the same process. Assuming that the thickness of the chip 33*a* is 70 µm, the thickness of the chip 33*b* is 50 µm, the thickness of the photosensitive resin layer 21 is 100 µm, the film thickness of the region overlapping with the surface on which the connection pads of the chip 33*a* are formed is 30 µm, and the film thickness of the region overlapping with the surface on which the connection pads of the chip 33*b* are formed is 50 µm, the aspect ratio of the via hole 43*a* is 1.0 and the aspect ratio of the via hole 43*b* is 1.25 when the diameter of the via hole 43*a* is 30 µm and the diameter of the via hole 43*b* is 40 µm.

Figure 18:
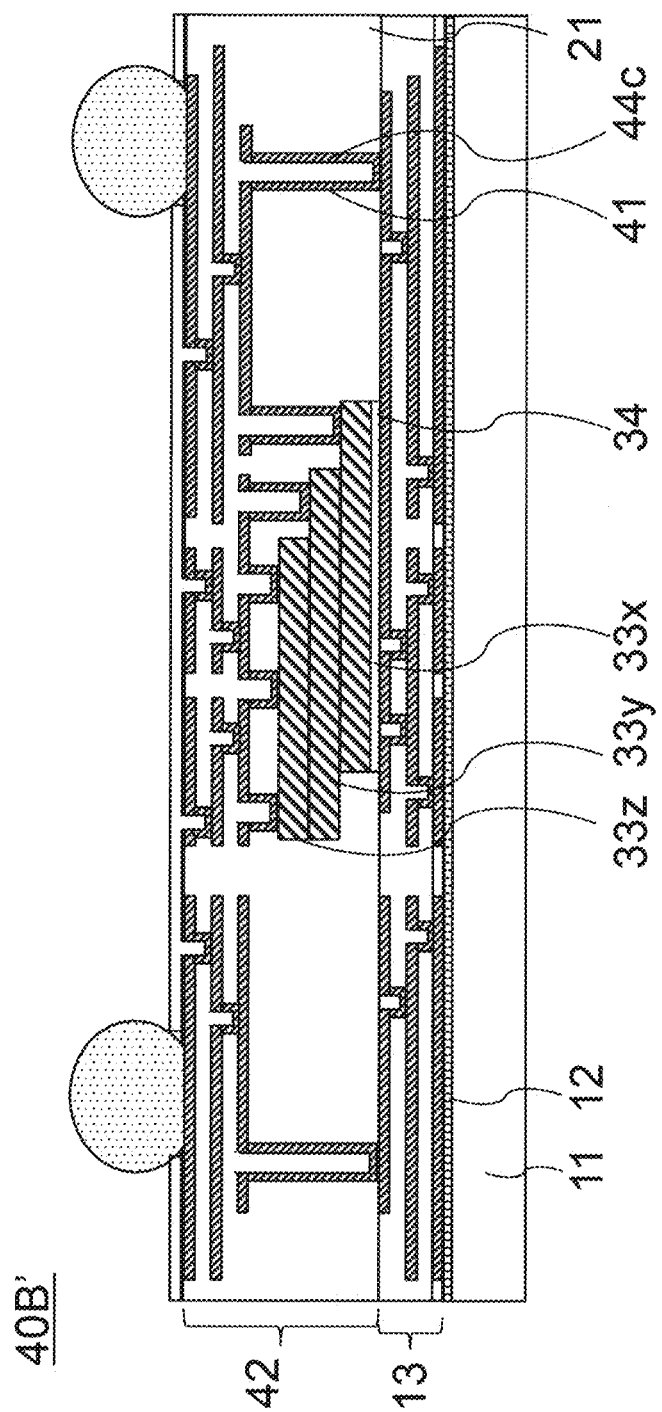
FIG. 18 is a cross-sectional view of a semiconductor device according to a modified example of the present invention.

A cross-sectional view of a semiconductor device 40B' according to another embodiment is shown in FIG. 18. In this embodiment, two memory chips 33*x*, 33*y*, and a storage controller chip 33*z* are stacked in a stepped manner so that their respective connection pad do not overlap (expose), and all of them are securely enclosed in the photosensitive resin layer 21. The thickness of the photosensitive resin layer 21 is 200 µm or less, and is 10 µm to 50 µm thicker than the total thickness of the chips 33*x*, 33*y*, and 33*z*. The thickness of the region overlapping with the chip surface having the connection pad of the uppermost chip (in this case, the chip 33*z*) is preferably 5 µm or more and 50 µm or less. Due to such stacked structure, the depths of the wiring photo via formed on the connection pad of the respective tips 33*x*, 33*y*, and 33*z* are different. The aspect ratio of these wiring photo via is desirably 1.5 or less.

It should be noted that the present invention is not limited to the above-mentioned embodiments and modified example, and can be appropriately modified within a range not deviating from the gist. In addition, each embodiment and modified example can be appropriately combined.

What is claimed is:

1. An electronic circuit device comprising:
a base substrate including a base wiring layer having a connection part;
at least one electronic circuit element; and
a re-distribution layer including a photosensitive resin layer, the photosensitive resin layer having insulation properties, the photosensitive resin layer enclosing a surface on which a connection part of the electronic circuit element is formed and a side surface of the electronic circuit element and embedding a first wiring photo via, a second wiring photo via and a wiring, the first wiring photo via having a bottom part directly connected to the connection part of the electronic circuit element, the second wiring photo via arranged at the outer periphery of the electronic circuit element and having a bottom part directly connected to the connection part of the base wiring layer, the wiring formed on a same surface parallel to a surface on which the connection part of the electronic circuit element is formed and electrically connected to the first wiring photo via and the second wiring photo via at each of upper parts opposite to the bottom parts of the first wiring photo via and the second wiring photo via; wherein,
the first wiring photo via and the second wiring photo via each have a continuous sidewall, for each of the first wiring photo via and the second wiring photo via, a distance between sidewalls of the upper part is narrower than a distance between sidewalls of an intermediate part between the bottom part and the upper part, a ratio of the distance between sidewalls of the upper part to the distance between sidewalls of an intermediate part of the first wiring photo via is smaller than that of the second wiring photo via, the ratio of the distance between sidewalls of the upper part to the distance between sidewalls of an intermediate part of each of the first wiring photo via and the second wiring photo via are more than ½ less than 1, and the intermediate part of the second wiring photo via is gently curved.

2. The electronic circuit device according to claim 1, wherein,
inside of the first wiring photo via and the second wiring photo via are filled with the photosensitive resin layer.

3. The electronic circuit device according to claim 1, wherein,
an aspect ratio of the first wiring photo via is 1.5 or less.

4. The electronic circuit device according to claim 1, wherein,
a plurality of the electronic circuit elements having different device thicknesses are fixed side by side so as to expose the connection part on a surface opposed to the surface on the base substrate side, and
the re-distribution layer includes a plurality of first wiring photo vias having different depths corresponding to each electronic circuit element, the plurality of first wiring photo vias electrically and directly connected to the connection part of each of the electronic circuit elements, respectively.

5. The electronic circuit device according to claim 1, wherein
a plurality of the electronic circuit elements are fixed in a stepwise manner so as to expose the connection part of the plurality of electronic circuit element, and
the re-distribution layer includes a plurality of first wiring photo vias having different depths corresponding to each electronic circuit element, the plurality of first wiring photo vias electrically and directly connected to the connection part of each of the electronic circuit elements, respectively.

6. A method of manufacturing an electronic circuit device, the method comprising:
forming a photosensitive resin layer by covering a surface on which a connection part of at least one electronic circuit element is formed and a side surface of the at least one electronic circuit element on a base substrate including a base wiring layer having a connection part, and flattening an upper surface of the photosensitive resin layer covering the surface on which the connection part of the electronic circuit element is formed;
forming a first via hole and a second via hole simultaneously by selectively exposing and developing the photosensitive resin layer, the first via hole exposing the connection part of at least one electronic circuit element, and the second via hole arranged around the electronic circuit element to expose the connection part of the base wiring layer; and
forming a first wiring photo via in the first via hole, a second wiring photo via in the second via hole and a wiring simultaneously, the first wiring photo via electrically connected to the connection part of the electronic circuit element, the second wiring photo via directly connected to the connection part of the base wiring layer, and the wiring for electrically connecting the first wiring photo via and the second wiring photo via on a same surface parallel to a surface on which the connection part of the electronic circuit element is formed; wherein,
a bottom part of the first wiring photo via and the second wiring photo via connected to the connection part of at least one electronic circuit element and the connection part of the base wiring layer and a sidewall of the first wiring photo via and the second wiring photo via are continuous, for each of the first wiring photo via and the second wiring photo via, a distance between sidewalls of an upper part opposite to the bottom part is narrower than a distance between sidewalls of an intermediate part between the bottom part and the upper part, a ratio of the distance between sidewalls of the upper part to the distance between sidewalls of an intermediate part of the first wiring photo via is smaller than that of the second wiring photo via, the ratio of the distance between sidewalls of the upper part to the distance between sidewalls of an intermediate part of the first wiring photo via and the second wiring photo via are more than ½ and less than 1, and the intermediate part of the second wiring photo via is gently curved.

7. The method of manufacturing an electronic circuit device according to claim 6, wherein
the first wiring photo via and the second wiring photo via are formed in a gentry contiguous curved surface between the sidewall and the bottom part.

8. The method of manufacturing an electronic circuit device according to 6, wherein,
a plurality of the electronic circuit elements having different device thicknesses are fixed side by side so as to expose the connection part on a surface opposed to the surface on the base substrate side.

9. The method of manufacturing an electronic circuit device according to 6, wherein,
a plurality of the electronic circuit elements are fixed in a stepwise manner so as to expose the connection part of the plurality.

\* \* \* \* \*